United States Patent
Lin et al.

(10) Patent No.: US 11,756,990 B2
(45) Date of Patent: Sep. 12, 2023

(54) CAPACITOR STRUCTURE AND MANUFACTURING METHOD THEREOF

(71) Applicant: Powerchip Semiconductor Manufacturing Corporation, Hsinchu (TW)

(72) Inventors: Wei-Yu Lin, Hsinchu (TW); Chuan-Chieh Lin, Hsinchu (TW)

(73) Assignee: Powerchip Semiconductor Manufacturing Corporation, Hsinchu (TW)

(*) Notice: Subject to any disclaimer, the term of this patent is extended or adjusted under 35 U.S.C. 154(b) by 13 days.

(21) Appl. No.: 17/583,211

(22) Filed: Jan. 25, 2022

(65) Prior Publication Data
US 2023/0223427 A1 Jul. 13, 2023

(30) Foreign Application Priority Data
Jan. 7, 2022 (TW) ................. 111100660

(51) Int. Cl.
*H01L 23/64* (2006.01)
*H01L 49/02* (2006.01)
*H01L 23/522* (2006.01)

(52) U.S. Cl.
CPC .......... *H01L 28/87* (2013.01); *H01L 23/5223* (2013.01); *H01L 23/642* (2013.01); *H01L 28/91* (2013.01); *H01L 28/92* (2013.01)

(58) Field of Classification Search
CPC .................. H01L 28/87; H01L 28/91
See application file for complete search history.

(56) References Cited

U.S. PATENT DOCUMENTS

| 6,355,517 B1 * | 3/2002 | Sunami | H10B 12/37 |
| | | | 257/E27.092 |
| 8,085,524 B2 | 12/2011 | Roozeboom et al. | |
| 8,283,750 B2 | 10/2012 | Guiraud et al. | |
| 10,403,710 B2 | 9/2019 | Voiron et al. | |

(Continued)

FOREIGN PATENT DOCUMENTS

| CN | 111902899 | 11/2020 |
| TW | 201830436 | 8/2018 |
| TW | 201926376 | 7/2019 |

OTHER PUBLICATIONS

"Office Action of Taiwan Counterpart Application", dated Jul. 4, 2022, p1-p9.

*Primary Examiner* — Ahmed N Sefer
(74) *Attorney, Agent, or Firm* — JCIPRNET

(57) ABSTRACT

A capacitor structure including a substrate, a first electrode, a first dielectric layer, a second electrode, a second dielectric layer, a third electrode, and a stress balance layer is provided. The substrate has trenches and a pillar portion located between two adjacent trenches. The first electrode is disposed on the substrate, on the pillar portion, and in the trenches. The first dielectric layer is disposed on the first electrode and in the trenches. The second electrode is disposed on the first dielectric layer and in the trenches. The second dielectric layer is disposed on the second electrode and in the trenches. The third electrode is disposed on the second dielectric layer and in the trenches. The third electrode has a groove, and the groove is located in the trench. The stress balance layer is disposed in the groove.

18 Claims, 24 Drawing Sheets

(56) References Cited

U.S. PATENT DOCUMENTS

| | | | |
|---|---|---|---|
| 2008/0291601 A1* | 11/2008 | Roozeboom | H01L 29/945 |
| | | | 257/E27.048 |
| 2010/0244189 A1* | 9/2010 | Klootwijk | H01L 28/90 |
| | | | 257/532 |
| 2011/0084360 A1* | 4/2011 | Kemerer | H01L 28/91 |
| | | | 257/532 |
| 2013/0043562 A1* | 2/2013 | Lehnert | H01L 21/28035 |
| | | | 257/E29.345 |
| 2013/0161792 A1* | 6/2013 | Tran | H01L 29/66083 |
| | | | 438/386 |
| 2014/0252543 A1* | 9/2014 | Li | H01L 28/88 |
| | | | 257/532 |
| 2018/0308638 A1* | 10/2018 | Ryou | H01L 28/75 |
| 2019/0074349 A1* | 3/2019 | Lin | H01L 21/31053 |
| 2019/0229181 A1* | 7/2019 | Jia | H01L 21/32134 |
| 2019/0378893 A1 | 12/2019 | Ashimine et al. | |
| 2020/0066922 A1* | 2/2020 | Cheng | H01L 27/016 |
| 2020/0176552 A1* | 6/2020 | Chang | H01L 23/5329 |

* cited by examiner

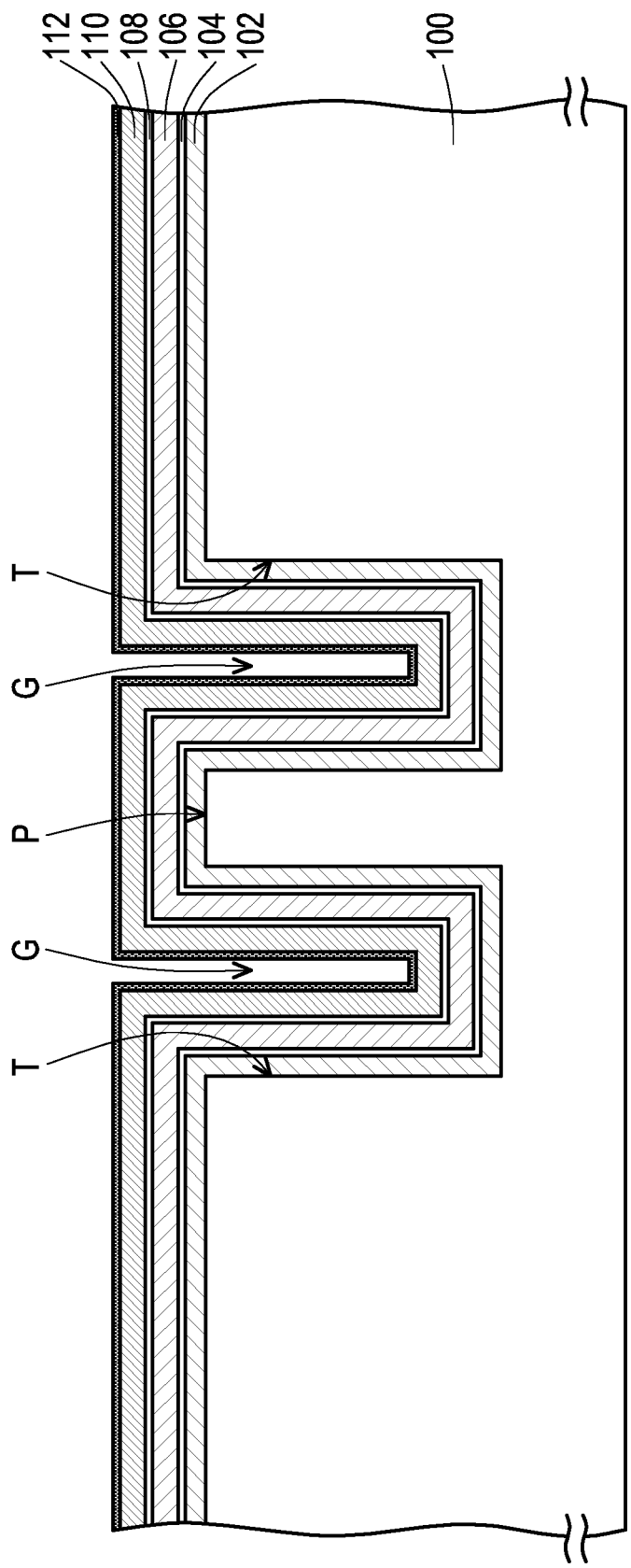

CAPACITOR STRUCTURE AND MANUFACTURING METHOD THEREOF

CROSS-REFERENCE TO RELATED APPLICATION

This application claims the priority benefit of Taiwan application serial no. 111100660, filed on Jan. 7, 2022. The entirety of the above-mentioned patent application is hereby incorporated by reference herein and made a part of this specification.

BACKGROUND OF THE INVENTION

Field of the Invention

The invention relates to a passive device structure, and particularly relates to a capacitor structure.

Description of Related Art

The capacitor is a passive device widely used in electronic products. However, in the capacitor, the stress (e.g., tensile stress) of the electrodes stacked on the substrate will cause the substrate to warp, so that the subsequent processes cannot be performed smoothly.

SUMMARY OF THE INVENTION

The invention provides a capacitor structure and a manufacturing method thereof, which can prevent the warpage of the substrate.

The invention provides a capacitor structure, which includes a substrate, a first electrode, a first dielectric layer, a second electrode, a second dielectric layer, a third electrode, and a stress balance layer. The substrate has trenches and a pillar portion located between two adjacent trenches. The first electrode is disposed on the substrate, on the pillar portion, and in the trenches. The first dielectric layer is disposed on the first electrode and in the trenches. The second electrode is disposed on the first dielectric layer and in the trenches. The second dielectric layer is disposed on the second electrode and in the trenches. The third electrode is disposed on the second dielectric layer and in the trenches. The third electrode has a groove, and the groove is located in the trench. The stress balance layer is disposed in the groove.

According to an embodiment of the invention, in the capacitor structure, the first electrode may directly contact the substrate.

According to an embodiment of the invention, in the capacitor structure, the first electrode, the second electrode, and the third electrode may have the same stress type.

According to an embodiment of the invention, in the capacitor structure, the stress type of the stress balance layer may be different from the stress type of the first electrode, the second electrode, and the third electrode.

According to an embodiment of the invention, in the capacitor structure, the stress type of the first dielectric layer and the second dielectric layer may be different from the stress type of the first electrode, the second electrode, and the third electrode.

According to an embodiment of the invention, the capacitor structure may further include a stop layer. The stop layer is disposed between the stress balance layer and the third electrode.

According to an embodiment of the invention, in the capacitor structure, the stress type of the stop layer may be different from the stress type of the first electrode, the second electrode, and the third electrode.

According to an embodiment of the invention, the capacitor structure may further include a third dielectric layer. The third dielectric layer is disposed on the first dielectric layer, the second electrode, the second dielectric layer, the third electrode, and the stress balance layer. The third dielectric layer has a first opening, a second opening, and a third opening. The first opening exposes the first electrode. The second opening exposes the second electrode. The third opening exposes the third electrode.

According to an embodiment of the invention, in the capacitor structure, there may be a first inclination angle between the sidewall and the bottom surface of the first opening. There may be a second inclination angle between the sidewall and the bottom surface of the second opening. There may be a third inclination angle between the sidewall and the bottom surface of the third opening.

According to an embodiment of the invention, in the capacitor structure, the angle ranges of the first inclination angle, the second inclination angle, and the third inclination angle may be 100 degrees to 115 degrees, respectively.

According to an embodiment of the invention, the capacitor structure may further include a first contact, a second contact, and a third contact. The first contact is disposed in the first opening and is electrically connected to the first electrode. The second contact is disposed in the second opening and is electrically connected to the second electrode. The third contact is disposed in the third opening and is electrically connected to the third electrode.

According to an embodiment of the invention, in the capacitor structure, there may be a first inclination angle between the sidewall and the bottom surface of the first contact. There may be a second inclination angle between the sidewall and the bottom surface of the second contact. There may be a third inclination angle between the sidewall and the bottom surface of the third contact.

According to an embodiment of the invention, the capacitor structure may further include a passivation layer. The passivation layer is disposed on the first contact, the second contact, the third contact, and the third dielectric layer.

According to an embodiment of the invention, the capacitor structure may further include an isolation layer. The isolation layer is disposed between the third dielectric layer and the first dielectric layer, between the third dielectric layer and the second electrode, between the third dielectric layer and the second dielectric layer, between the third dielectric layer and the third electrode, and between the third dielectric layer and the stress balance layer. The first opening, the second opening, and the third opening may respectively extend into the isolation layer.

According to an embodiment of the invention, in the capacitor structure, the first electrode and the third electrode may be electrically connected to each other.

The invention provides a manufacturing method of a capacitor structure, which includes the following steps. A substrate is provided. The substrate has trenches and a pillar portion located between two adjacent trenches. A first electrode is formed on the substrate, on the pillar portion, and in the trenches. A first dielectric layer is formed on the first electrode and in the trenches. A second electrode is formed on the first dielectric layer and in the trenches. A second dielectric layer is formed on the second electrode and in the trenches. A third electrode is formed on the second dielectric layer and in the trenches. The third electrode has a groove, and the groove is located in the trench. A stress balance layer is formed in the groove.

According to an embodiment of the invention, the manufacturing method of the capacitor structure may further include the following step. A stop layer is formed between the stress balance layer and the third electrode.

According to an embodiment of the invention, the manufacturing method of the capacitor structure may further include the following steps. A third dielectric layer is formed on the first dielectric layer, the second electrode, the second dielectric layer, the third electrode, and the stress balance layer. The first opening, the second opening, and the third opening are formed in the third dielectric layer. The first opening exposes the first electrode. The second opening exposes the second electrode. The third opening exposes the third electrode.

According to an embodiment of the invention, the manufacturing method of the capacitor structure may further include the following step. A first contact, a second contact, and a third contact are respectively formed in the first opening, the second opening, and the third opening. The first contact, the second contact, and the third contact may be electrically connected to the first electrode, the second electrode, and the third electrode respectively.

According to an embodiment of the invention, in the manufacturing method of the capacitor structure, there may be a first inclination angle between the sidewall and the bottom surface of the first contact. There may be a second inclination angle between the sidewall and the bottom surface of the second contact. There may be a third inclination angle between the sidewall and the bottom surface of the third contact.

Based on the above description, in the capacitor structure and the manufacturing method thereof according to the invention, the stress balance layer is located in the groove of the third electrode. Since the stress of the first electrode, the stress of the second electrode, and the stress of the third electrode can be significantly offset by the stress of the stress balance layer, the warpage of the substrate can be prevented, which enables the subsequent processes to proceed smoothly.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1A:
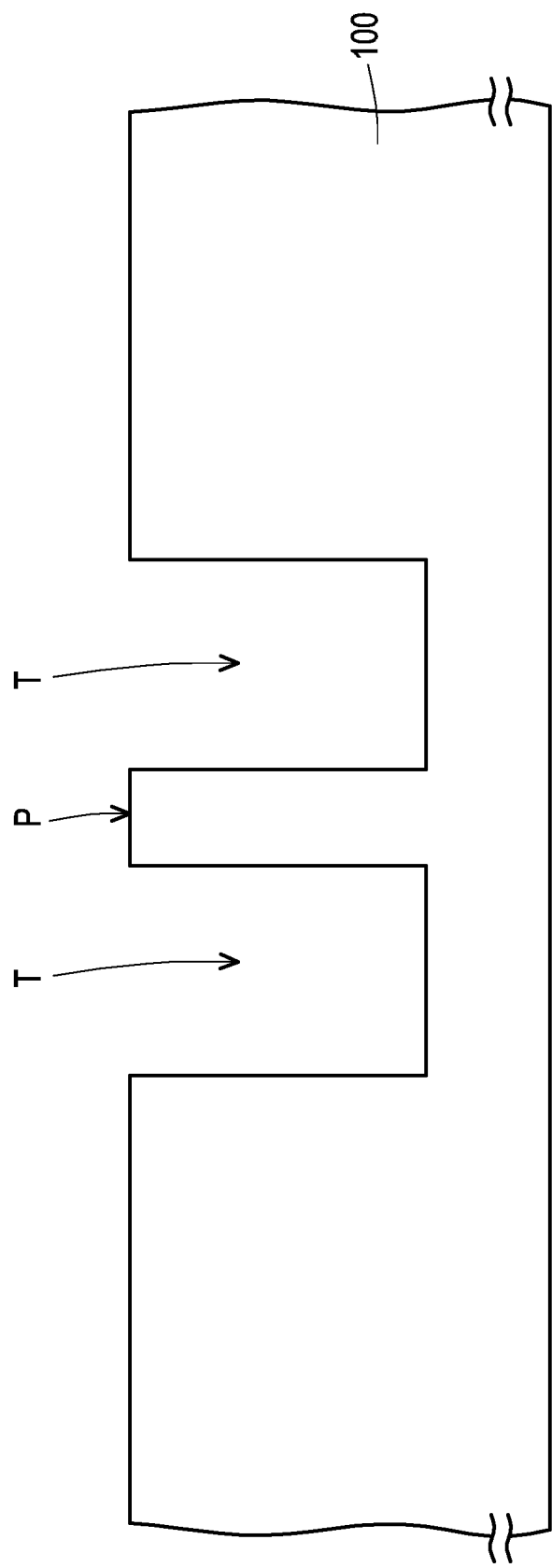
FIG. 1A to FIG. 1P are cross-sectional views illustrating a manufacturing process of a capacitor structure according to some embodiments of the invention.
Figure 1B:
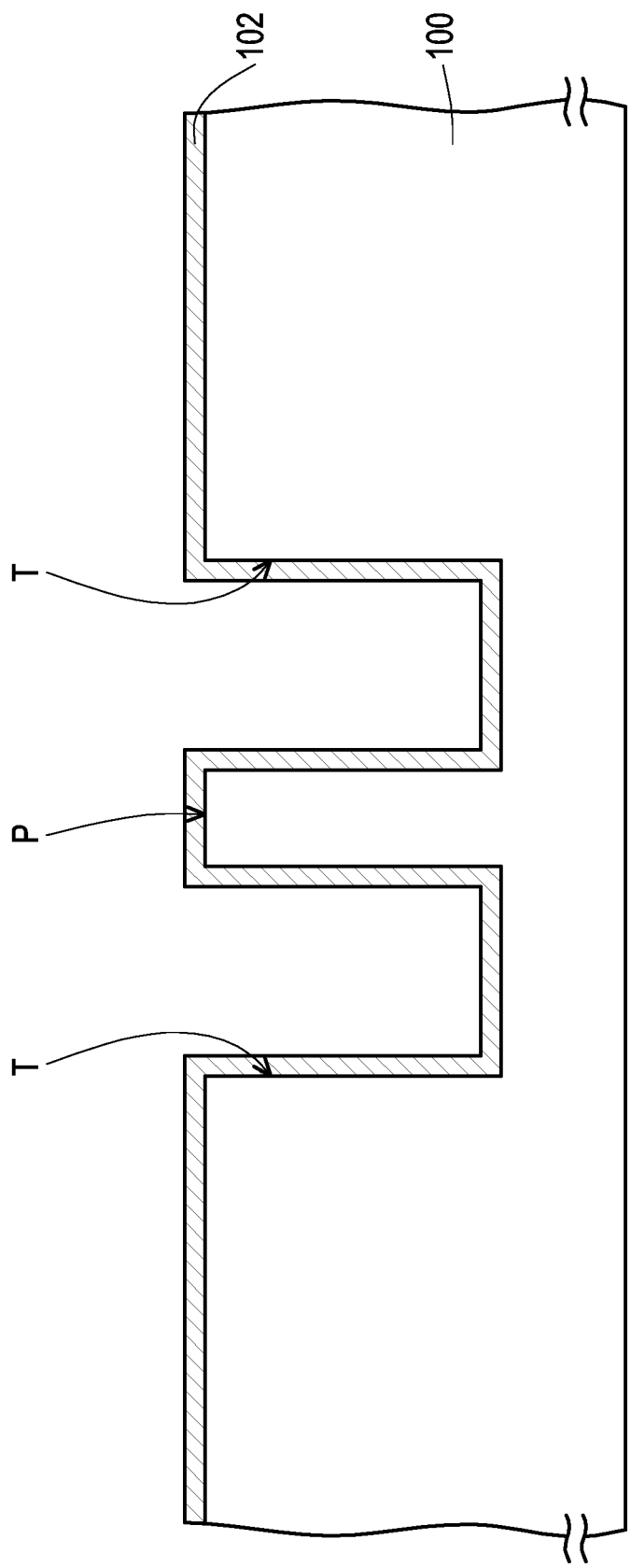
Figure 1C:
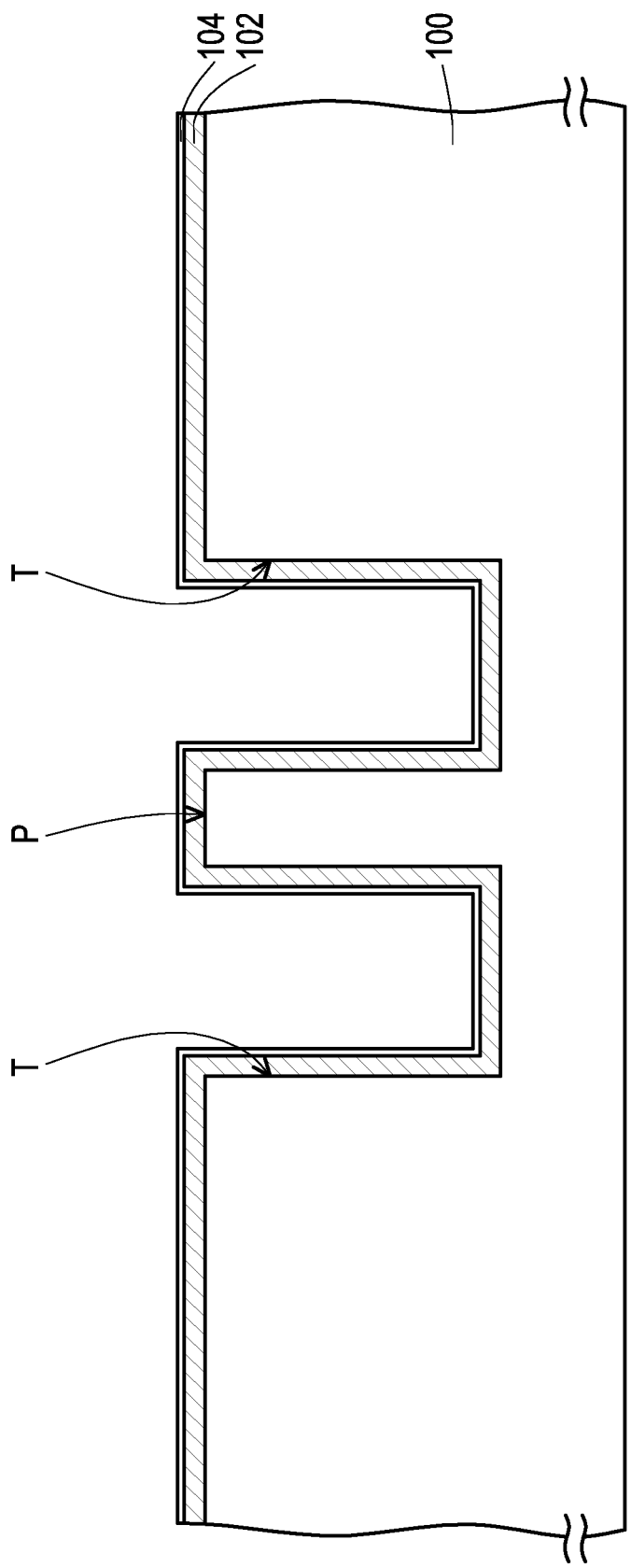
Figure 1D:
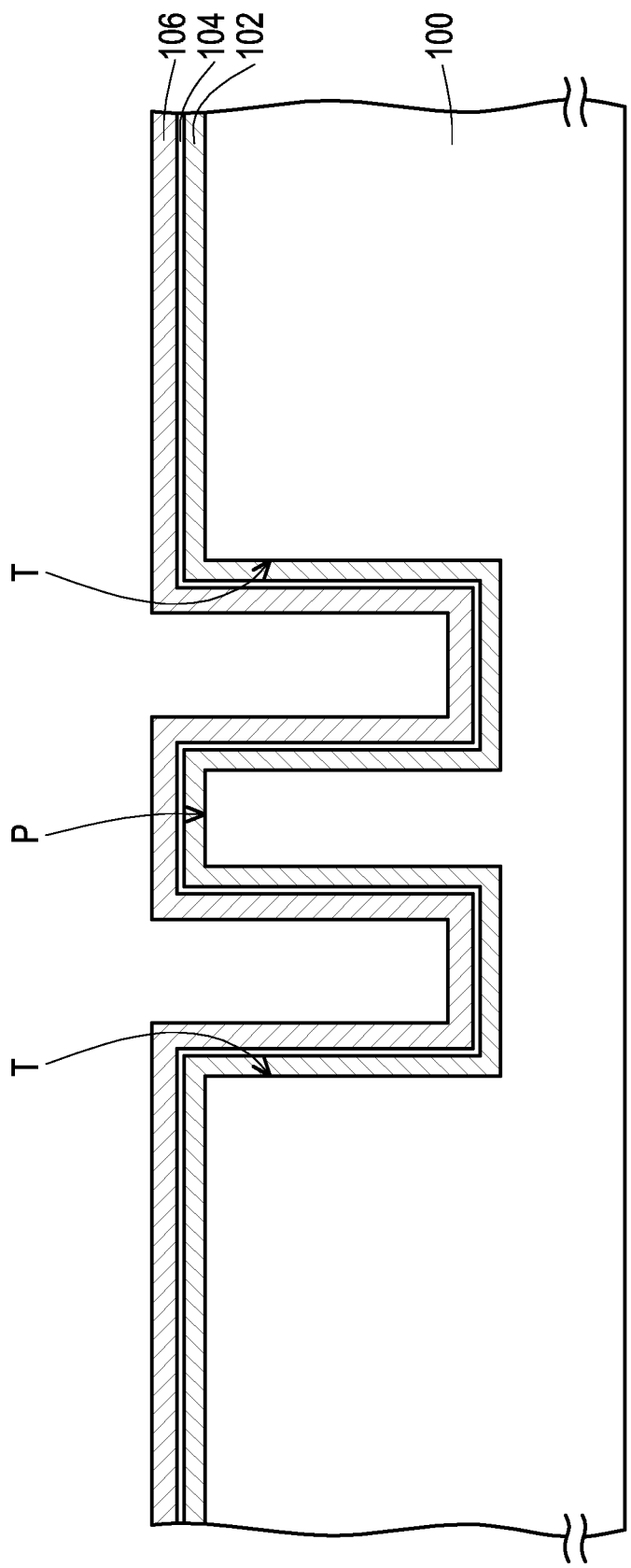
Figure 1E:
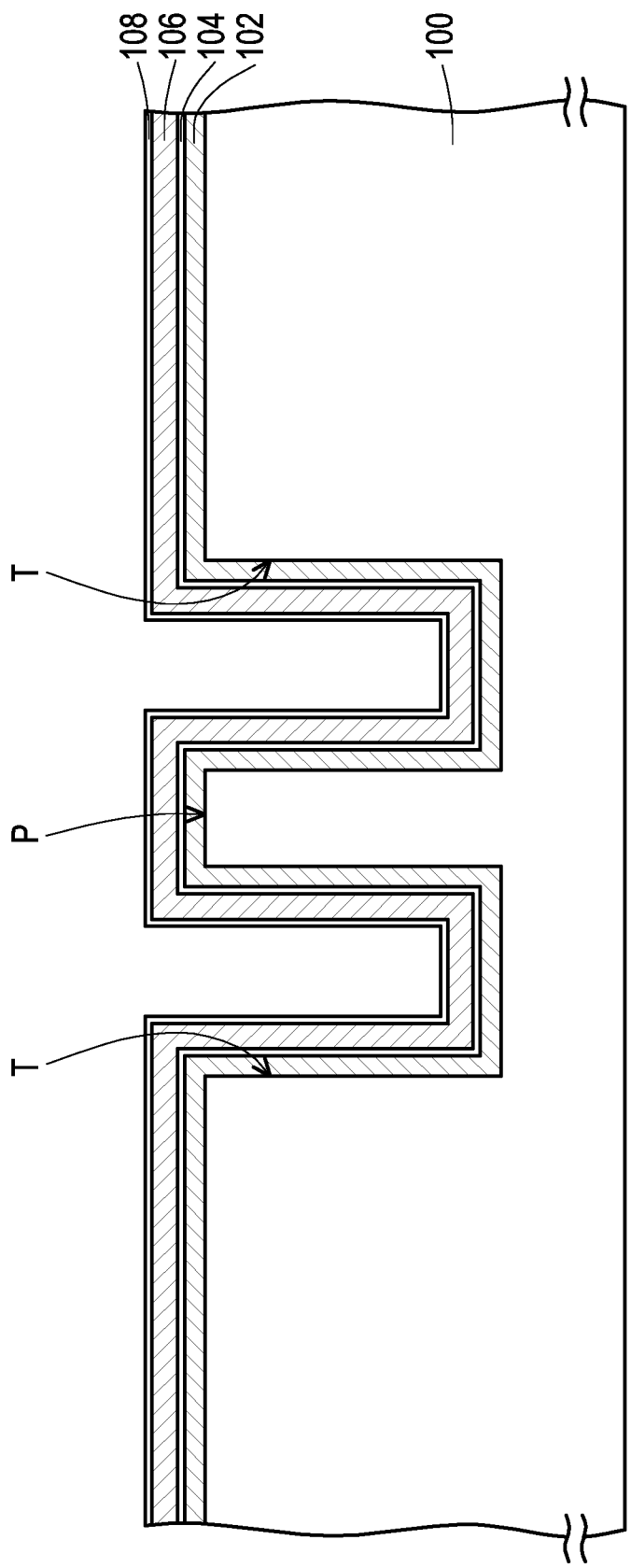
Figure 1F:
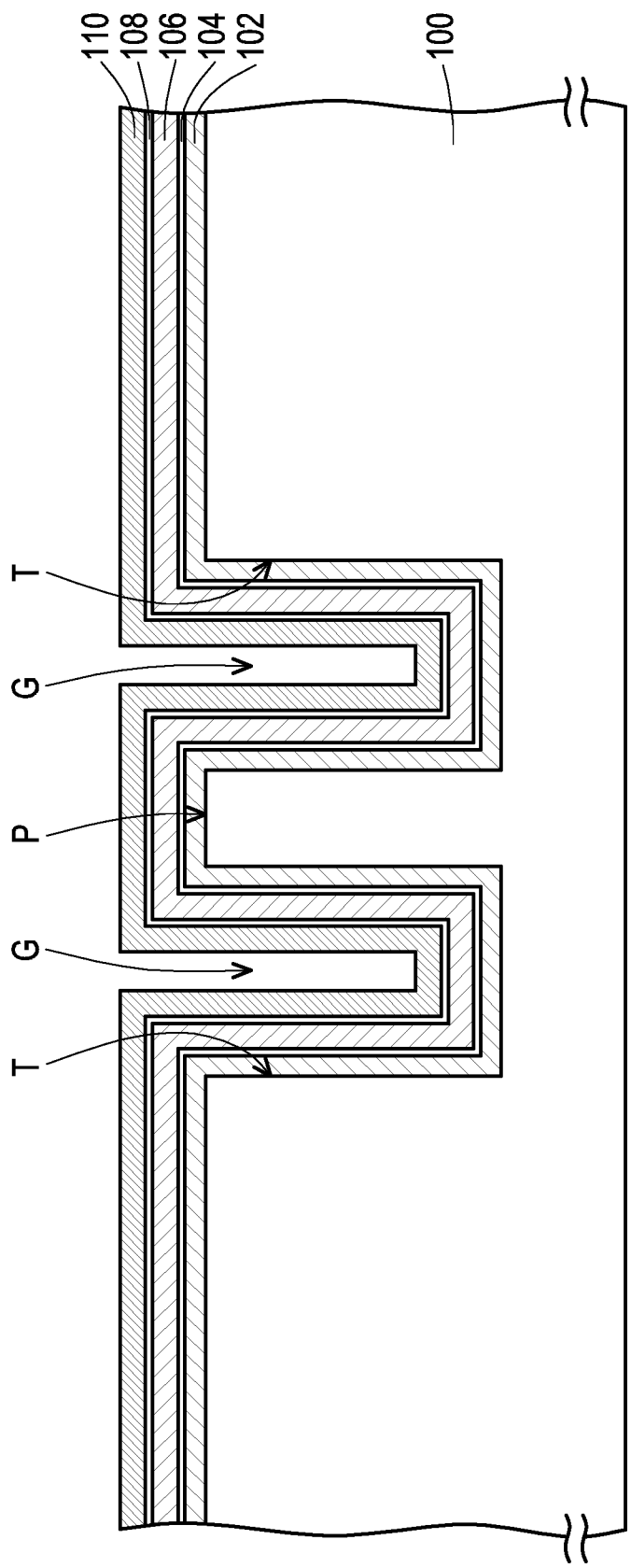
Figure 1H:
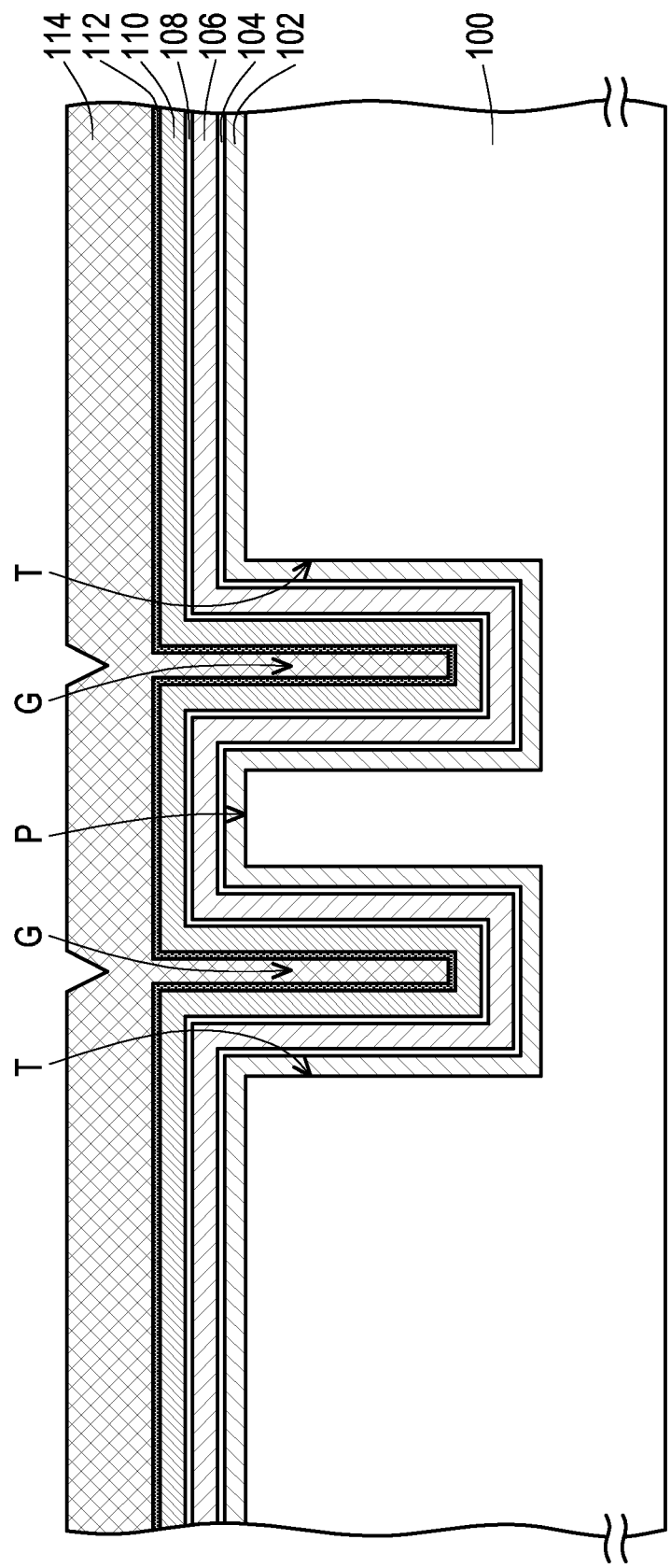
Figure 1I:
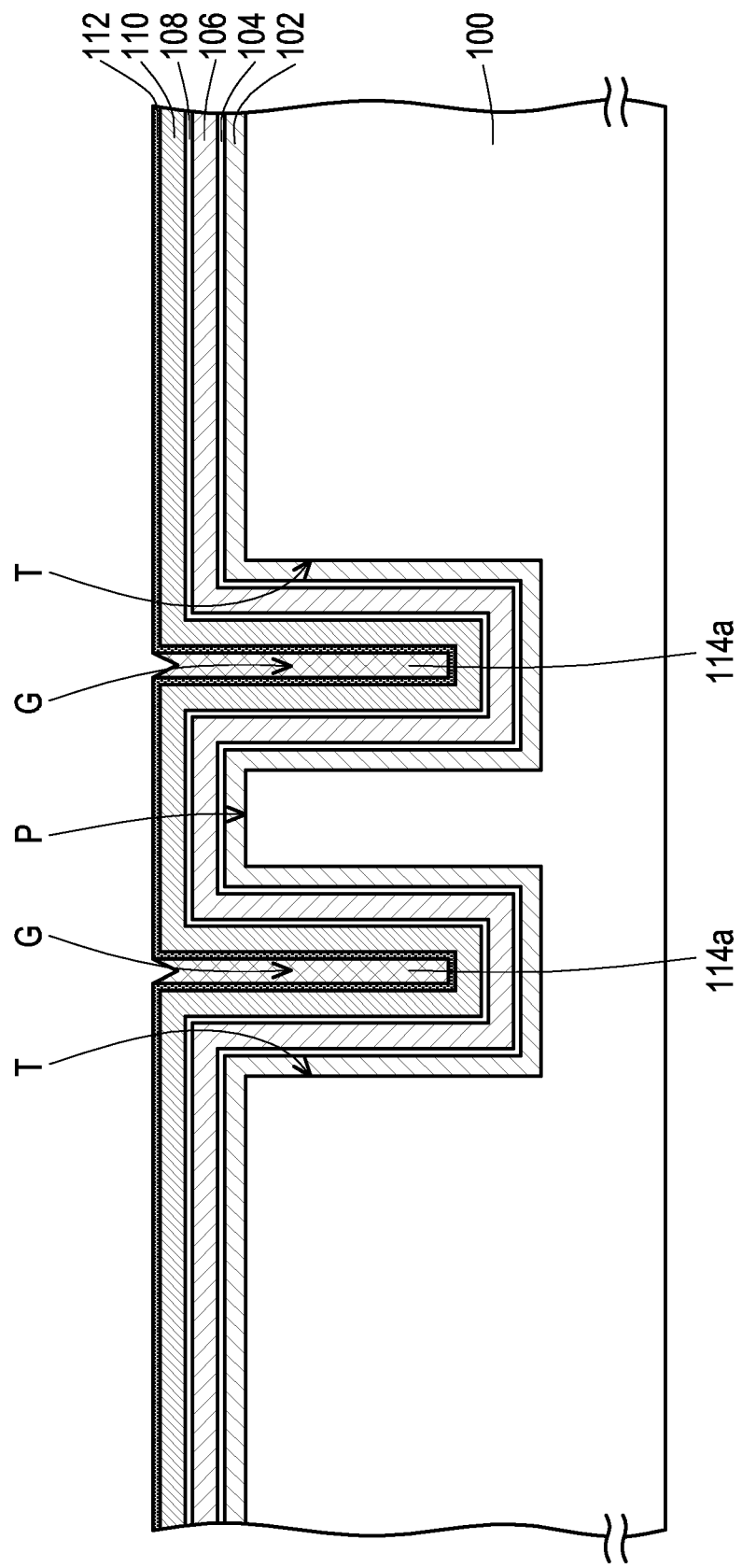
Figure 1J:
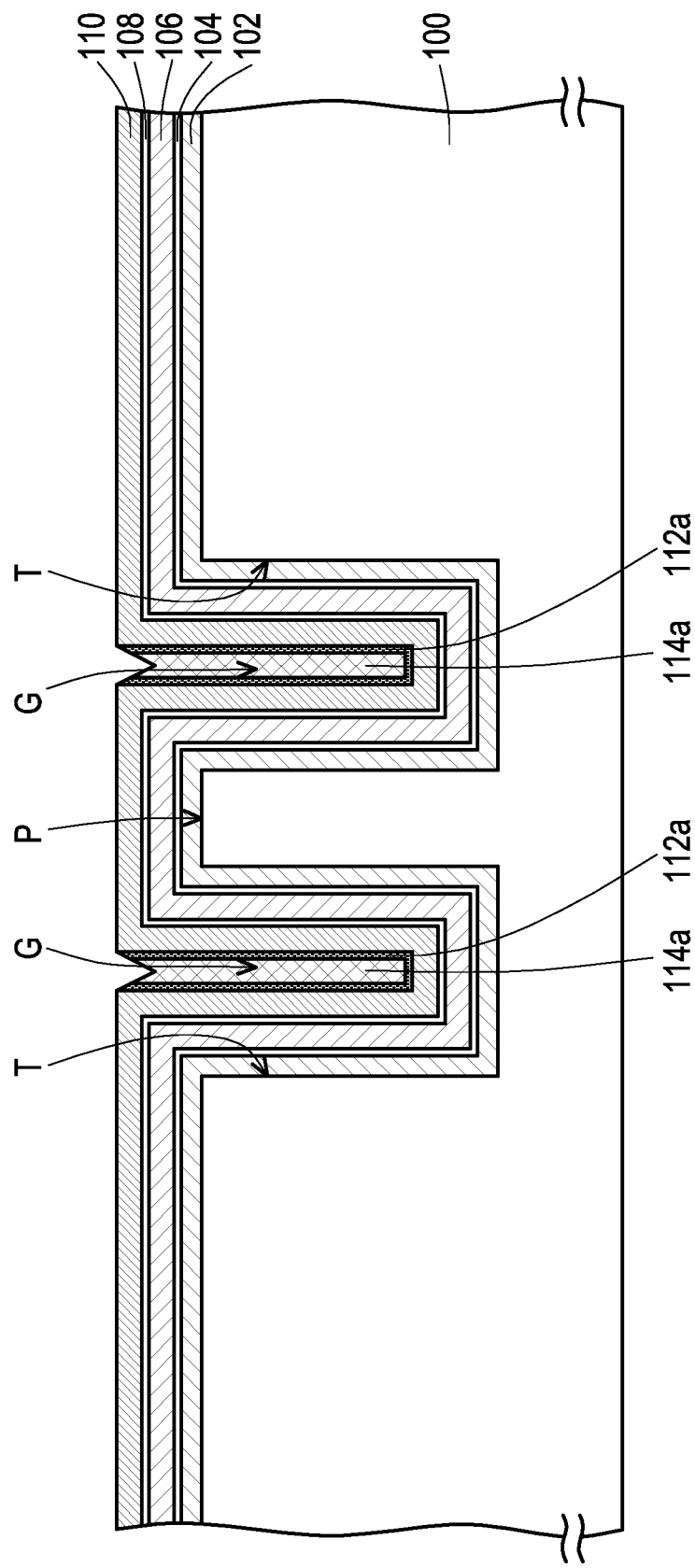
Figure 1K:
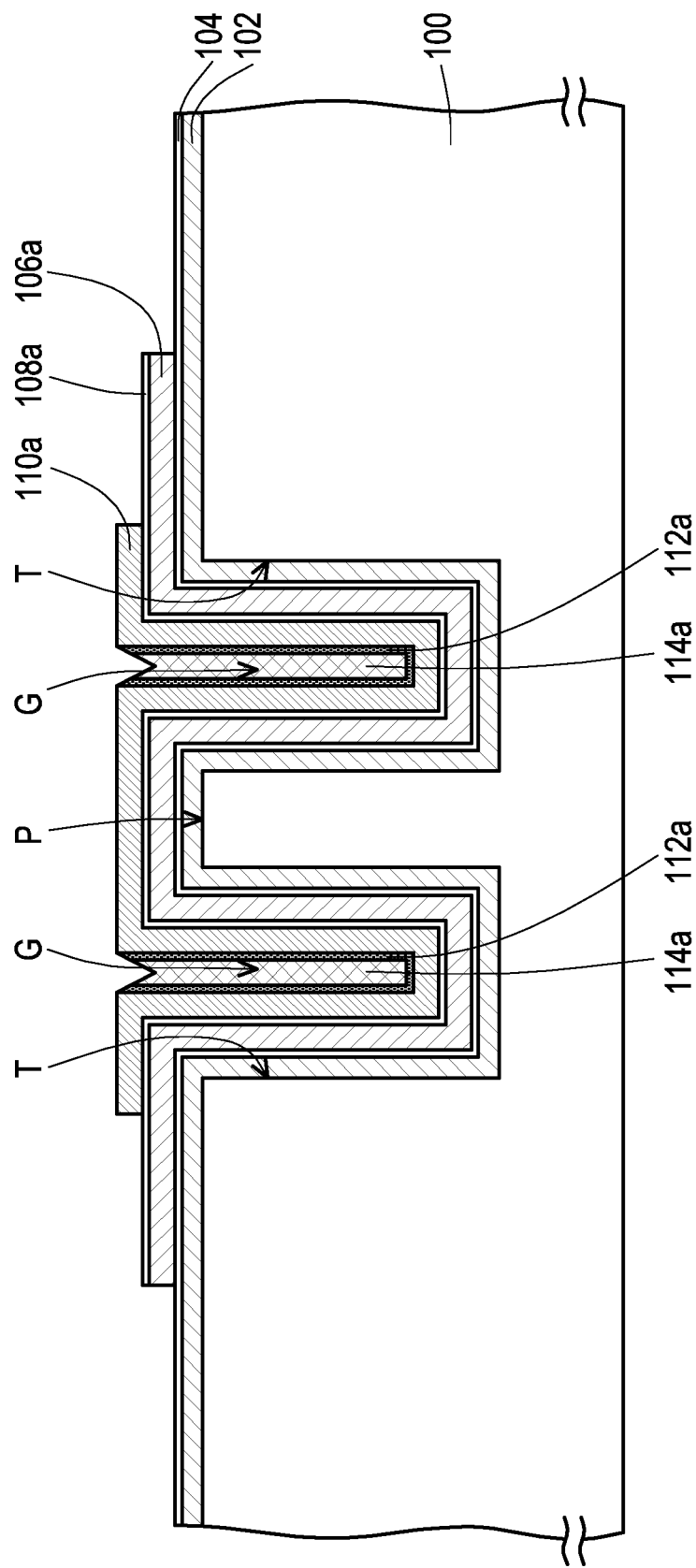
Figure 1L:
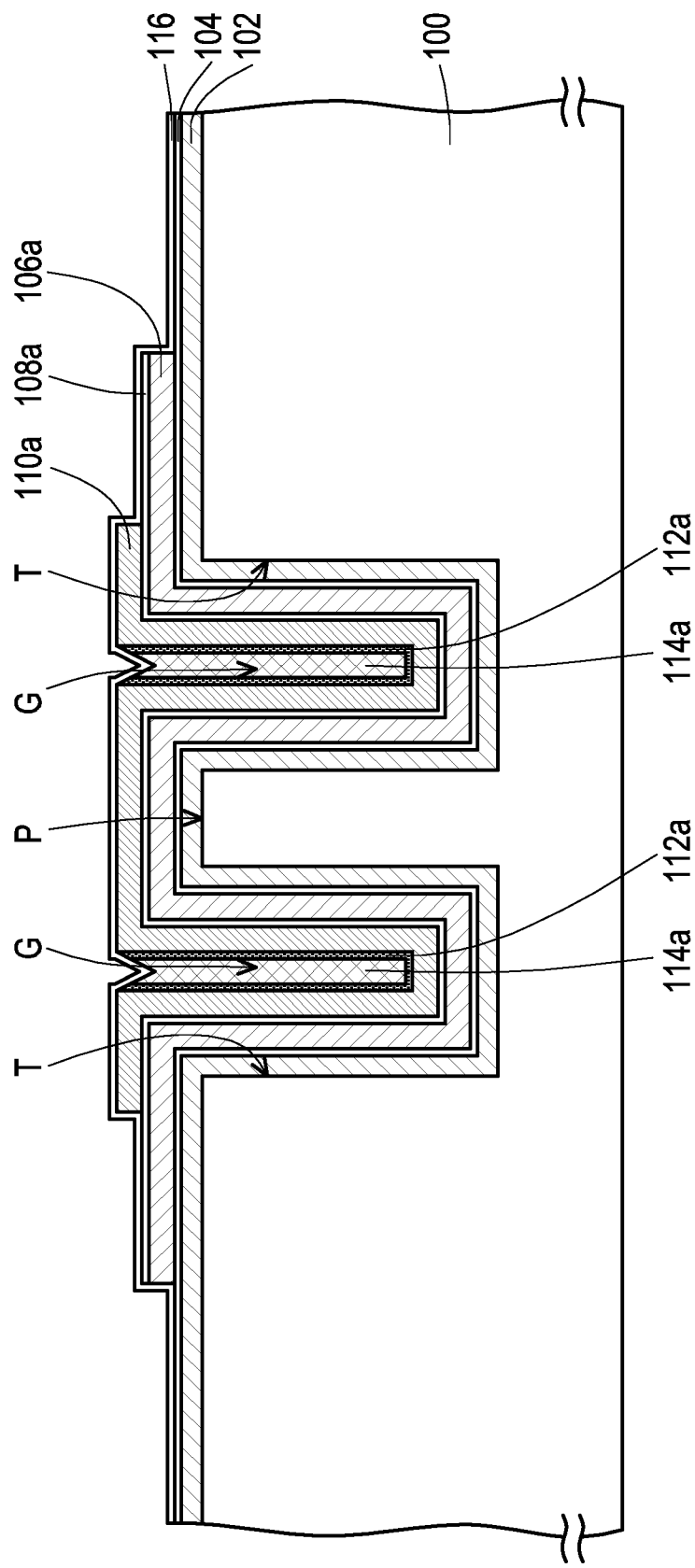
Figure 1M:
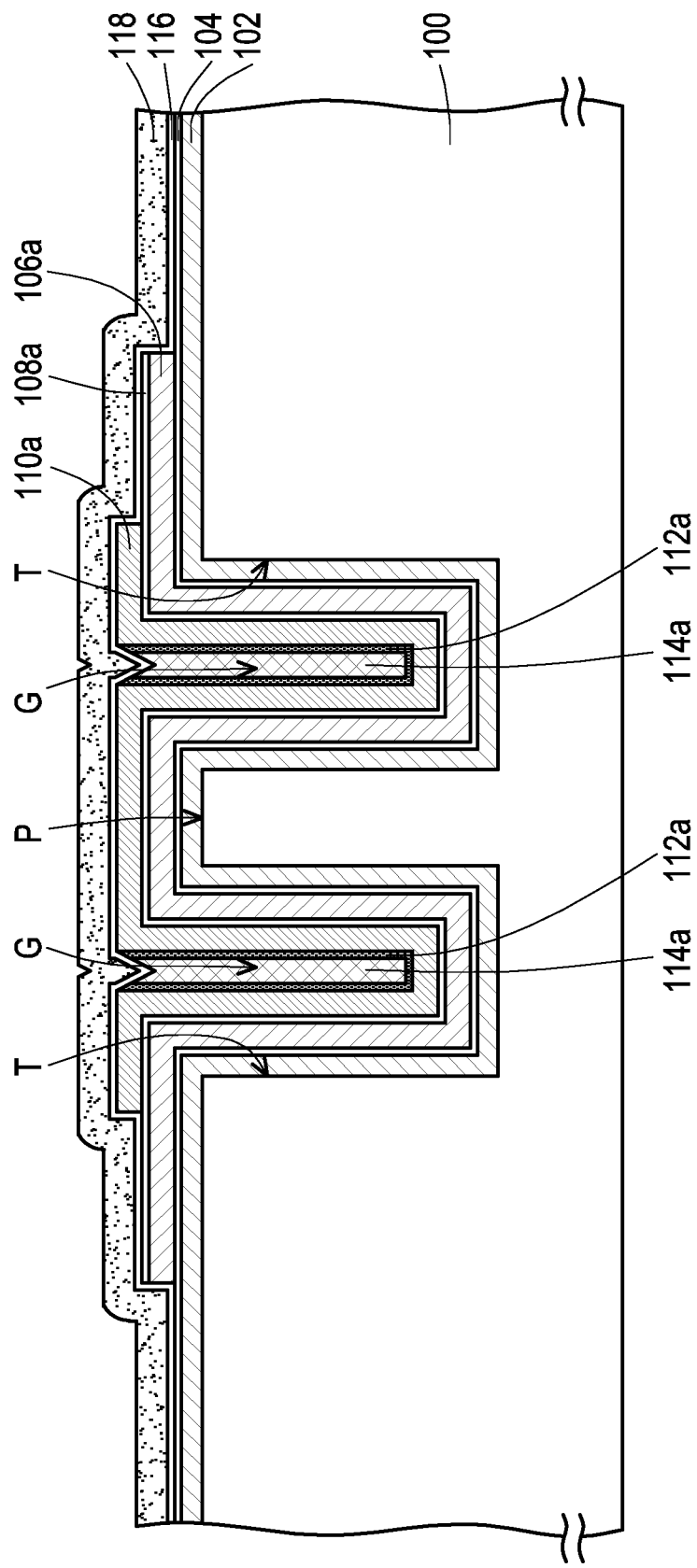
Figure 1N:
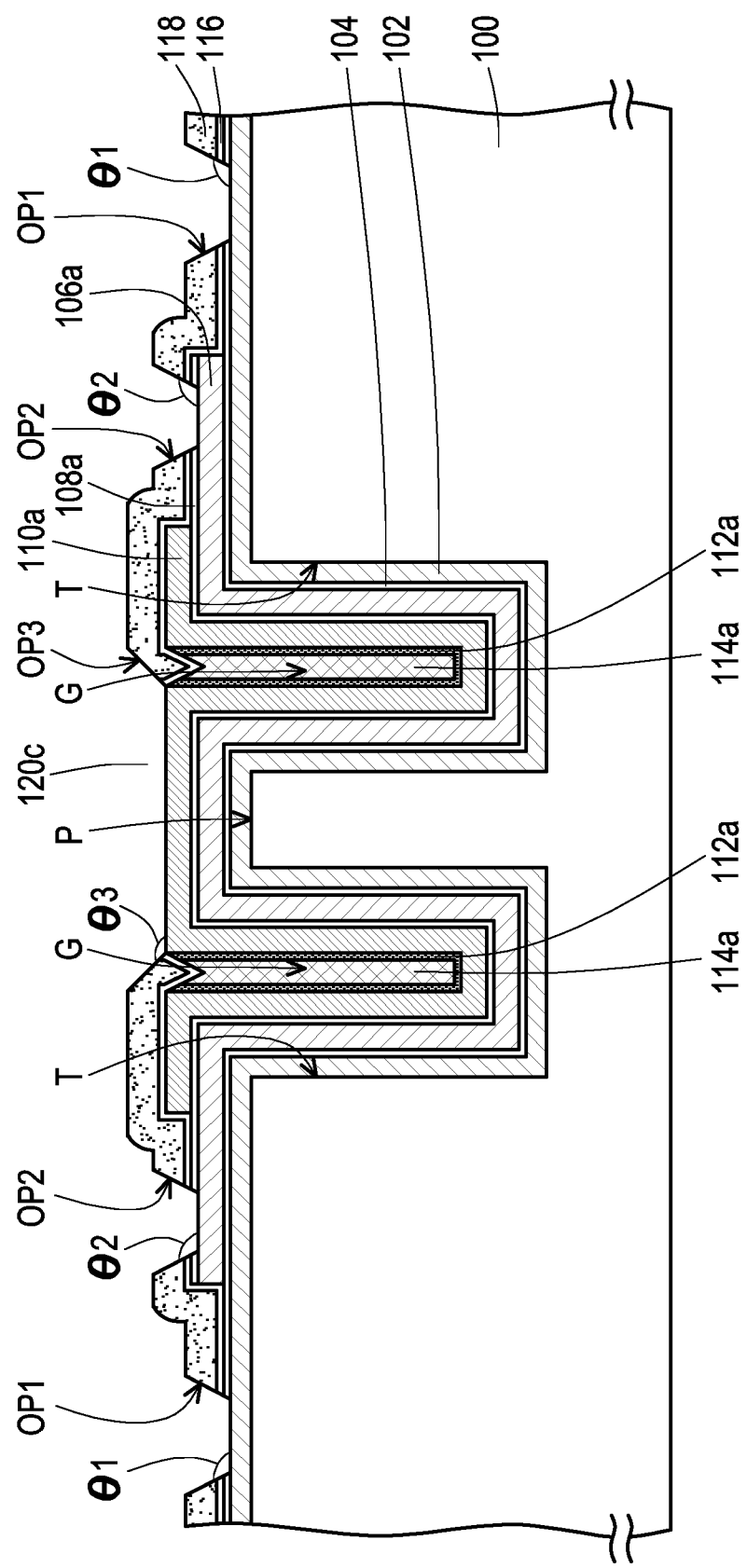
Figure 10:
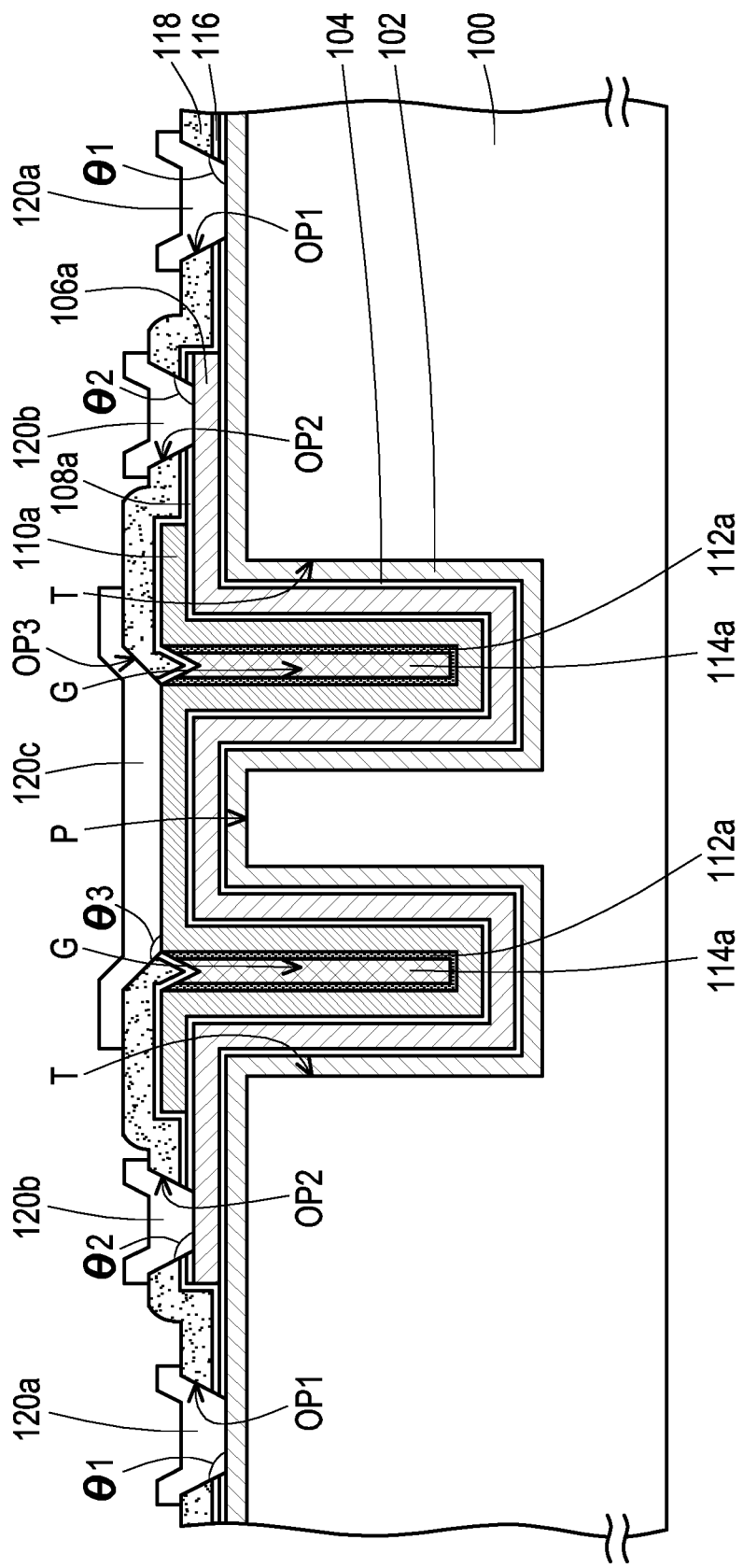
Figure 1P:
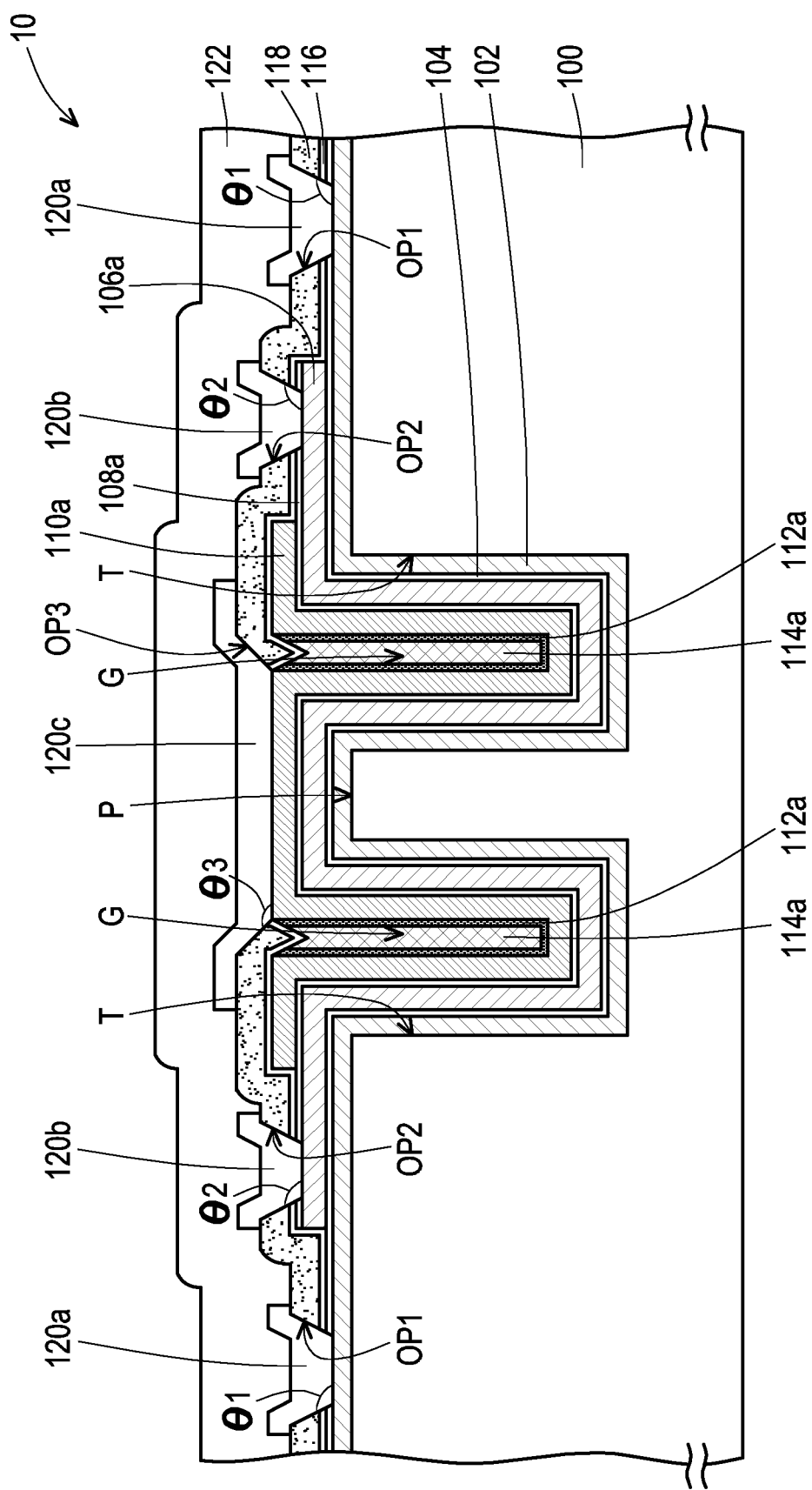
Figure 2A:
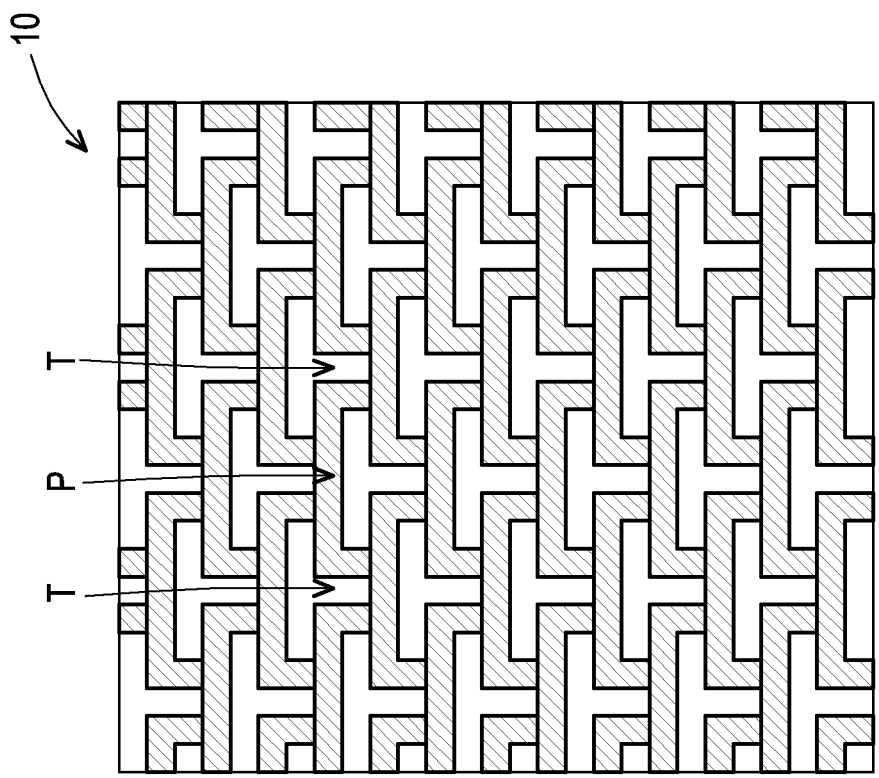
FIG. 2A to FIG. 2P are top views illustrating a substrate according to some embodiments of the invention.
Figure 2B:
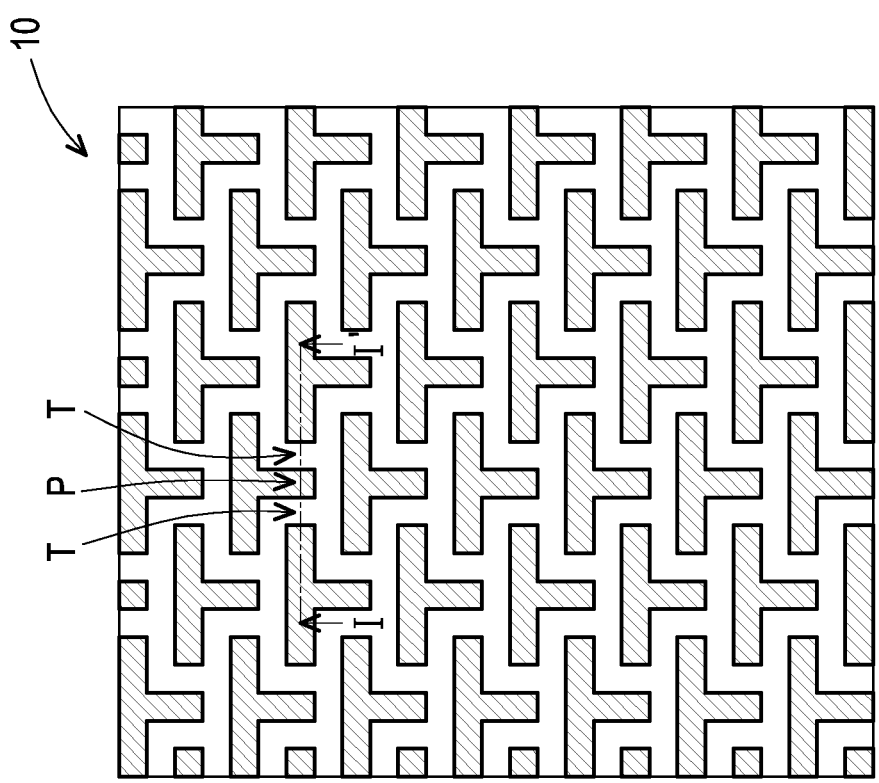
Figure 2D:
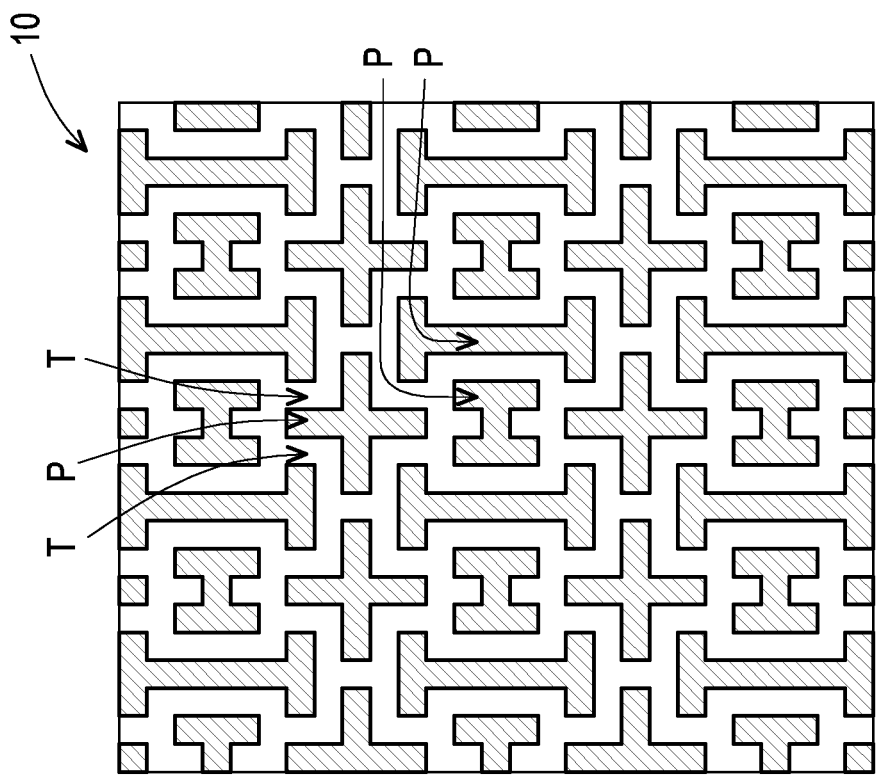
Figure 2C:
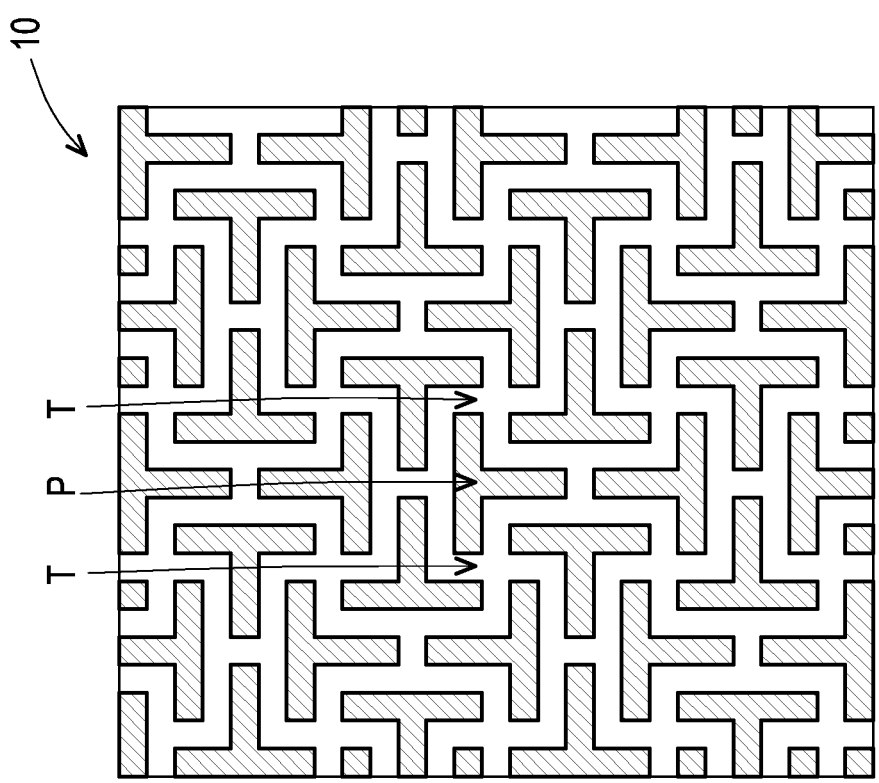
Figure 2F:
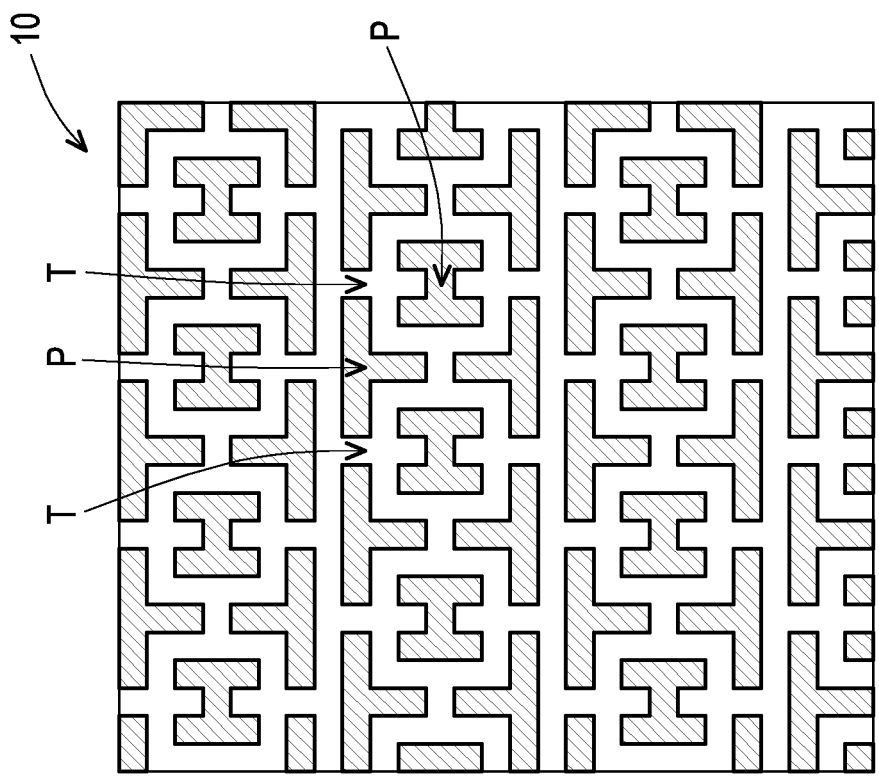
Figure 2E:
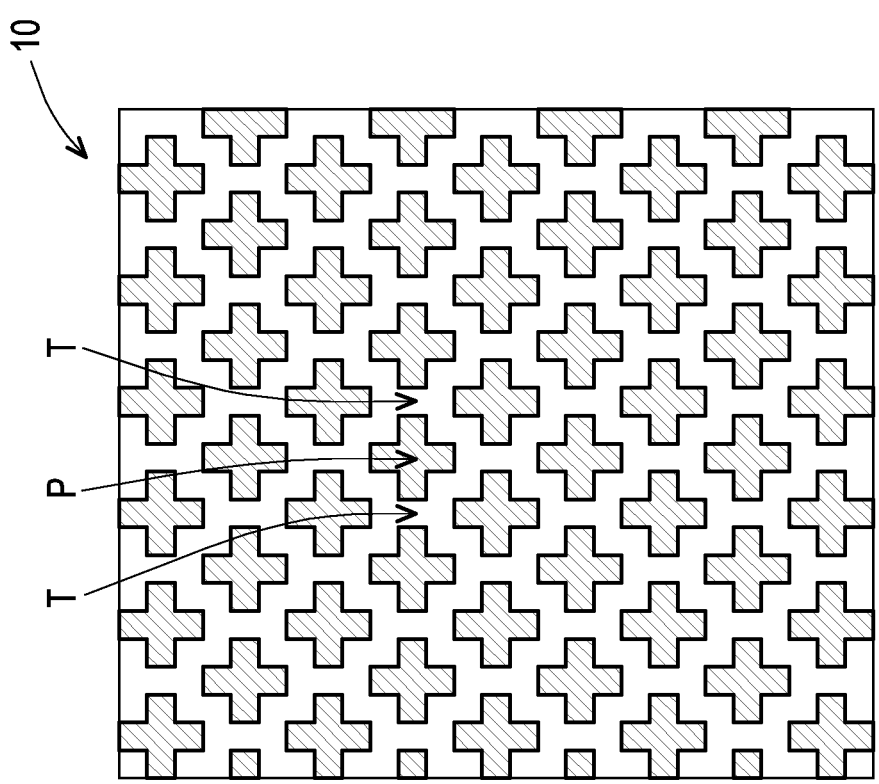
Figure 2H:
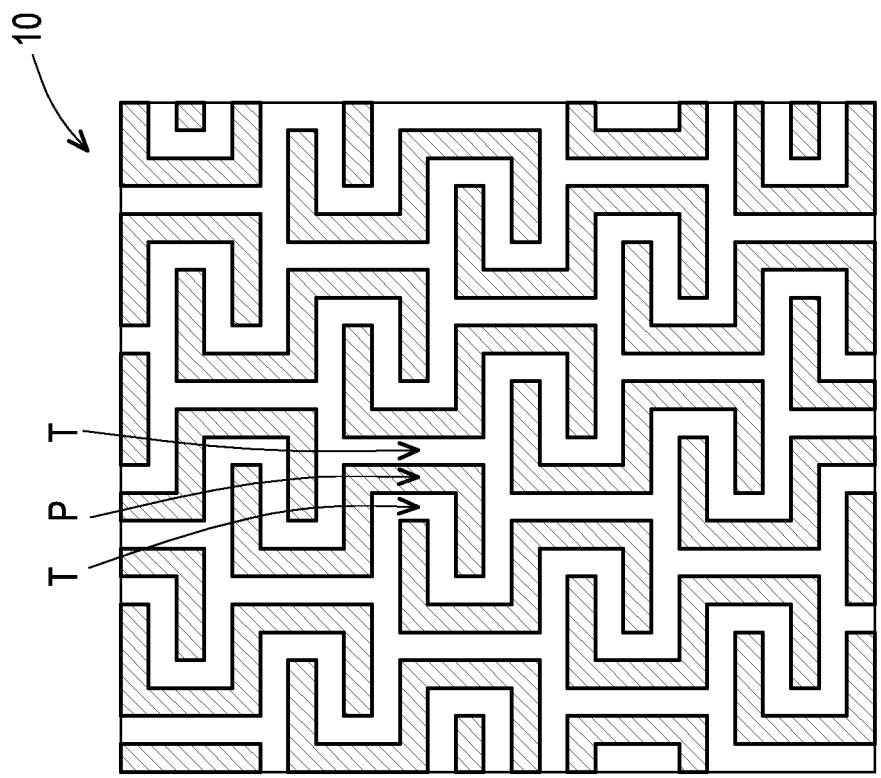
Figure 2G:
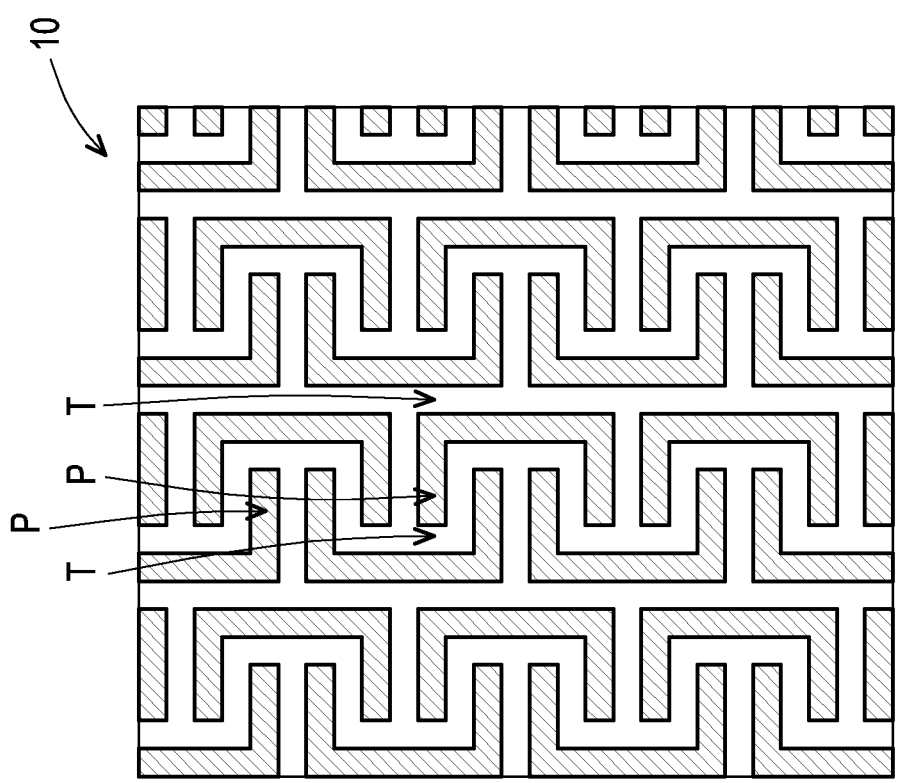
Figure 2J:
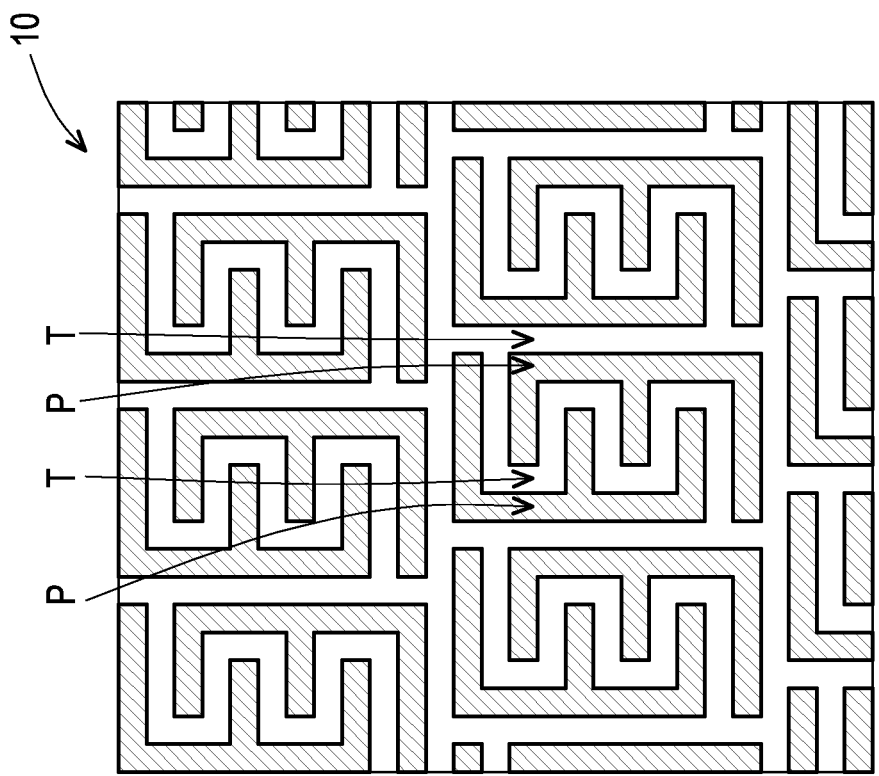
Figure 2I:
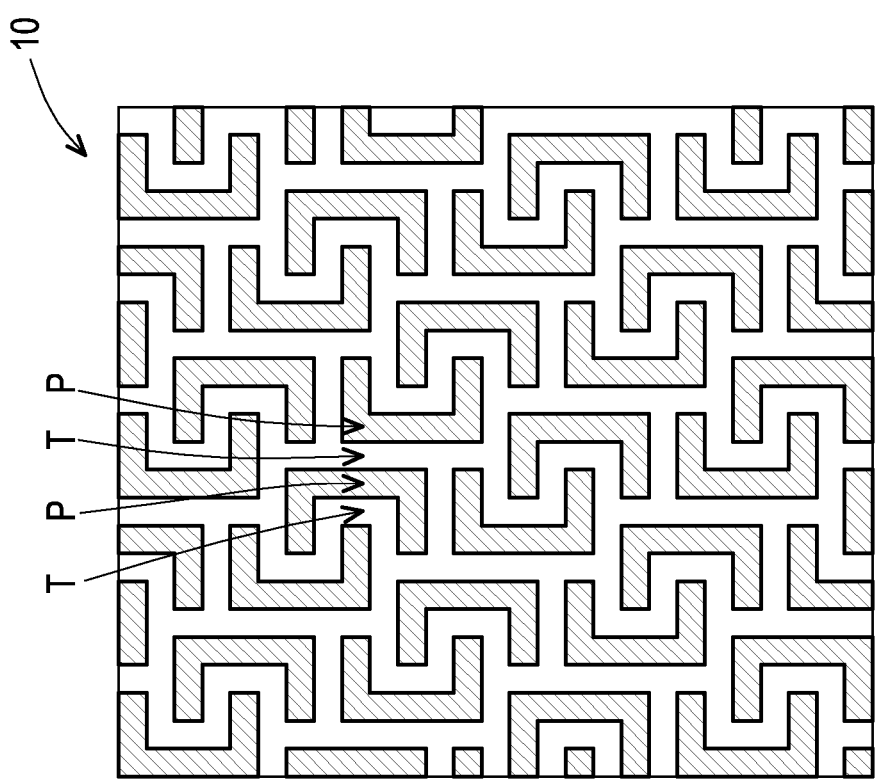
Figure 2L:
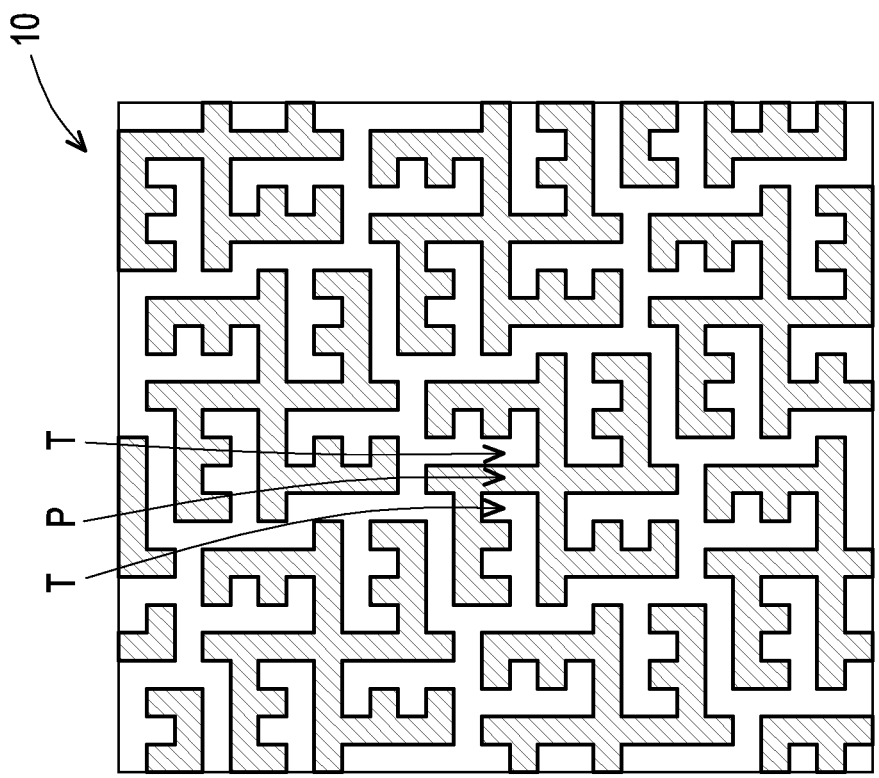
Figure 2K:
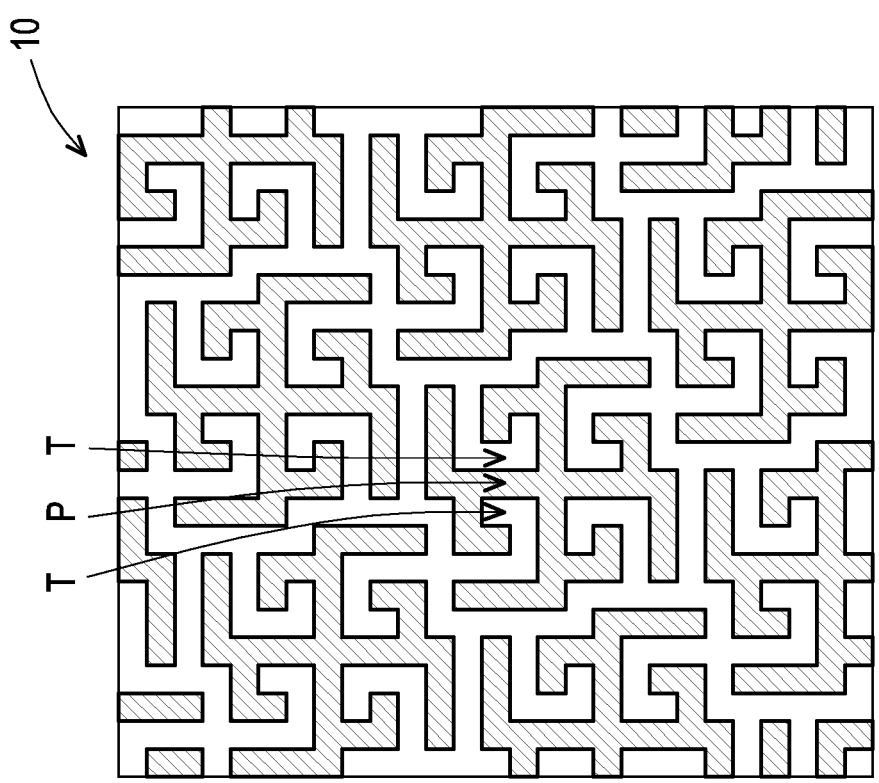
Figure 2N:
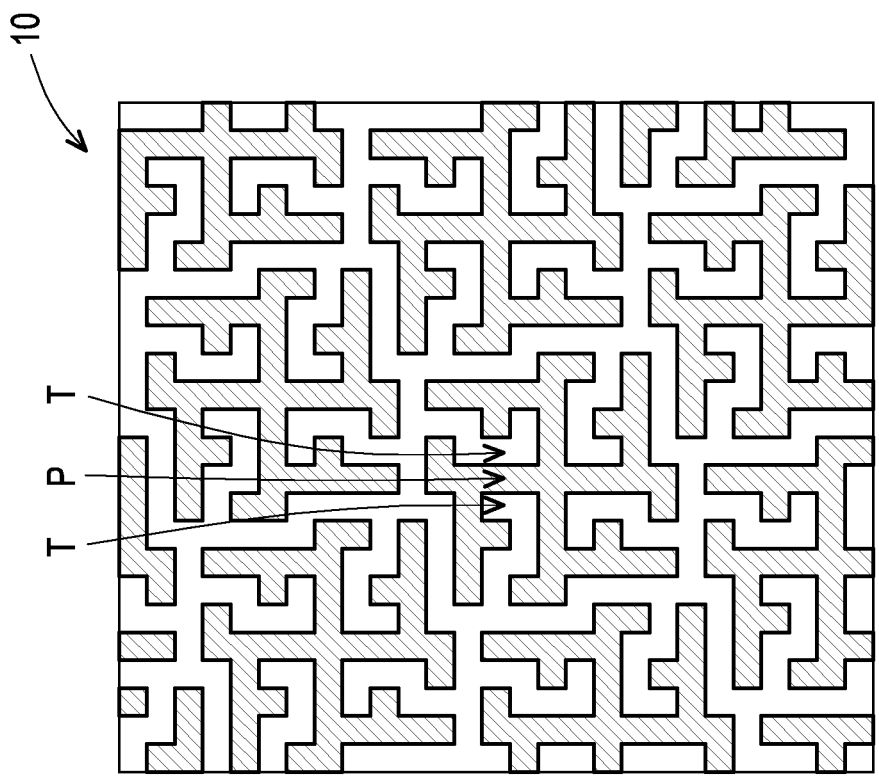
Figure 2M:
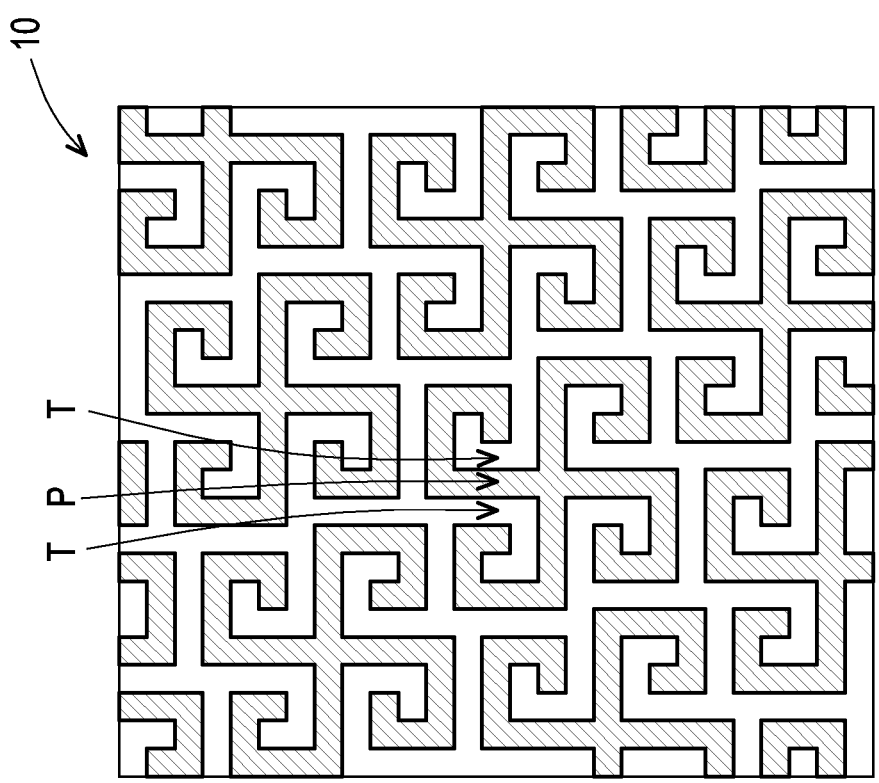
Figure 2P:
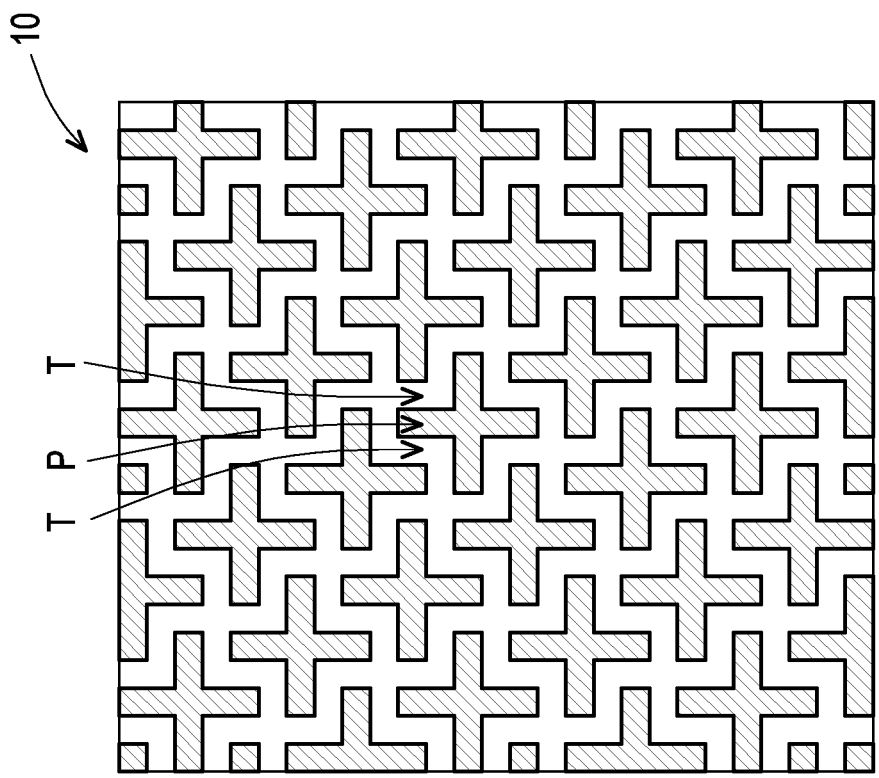
Figure 2O:
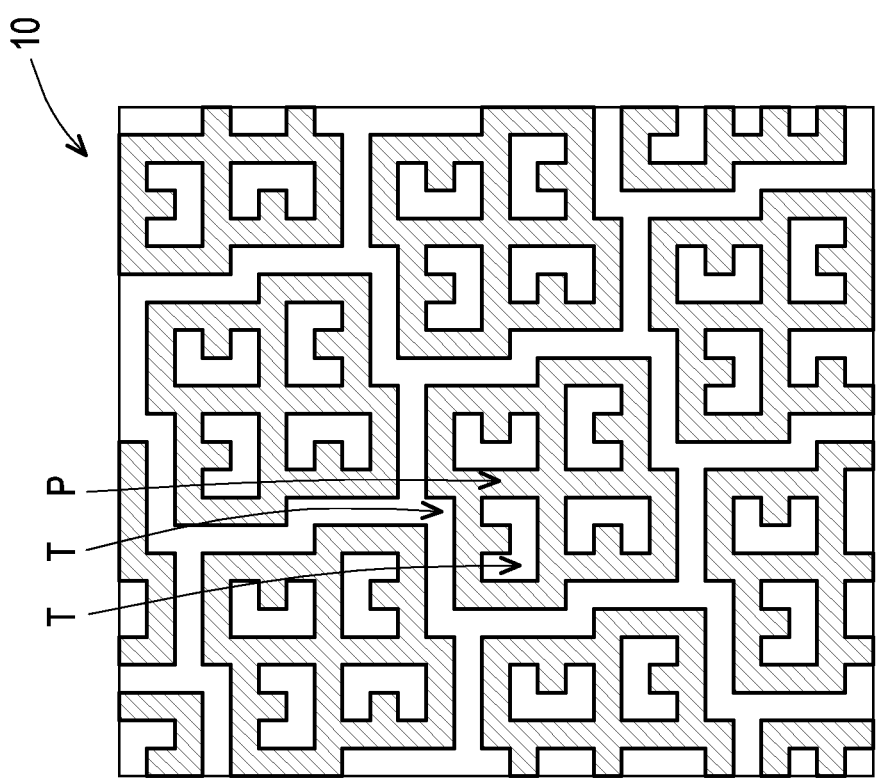

FIG. 1A to FIG. 1P are cross-sectional views illustrating a manufacturing process of a capacitor structure according to some embodiments of the invention. FIG. 2A to FIG. 2P are top views illustrating a substrate according to some embodiments of the invention. FIG. 1A to FIG. 1P are cross-sectional views taken along a section line I-I' in FIG. 2A.

Referring to FIG. 1A and FIG. 2A, a substrate 100 is provided. The substrate 100 may be a semiconductor substrate such as a silicon substrate. In some embodiments, the substrate 100 may have an N-type conductive type or a P-type conductive type. In the present embodiment, the substrate 100 has, for example, the N-type conductivity, but the invention is not limited thereto.

The substrate 100 has trenches T and a pillar portion P located between two adjacent trenches T. In the present embodiment, as shown in FIG. 2A, the top-view shape of the pillar portion P may be a T-shape, but the invention is not limited thereto. In other embodiments, the top-view shape of the pillar portion P may be the shape shown in FIG. 2A to FIG. 2P. In addition, as shown in FIG. 2A to FIG. 2P, the trenches T may or may not be connected to each other. In some embodiments, the trench T may be formed by patterning the substrate 100 through a lithography process and an etching process (e.g., a dry etching process). In other embodiments, the trench T may be formed by performing a dry etching process on the substrate 100 by using the patterned hard mask layer as a mask.

Referring to FIG. 1B, an electrode 102 is formed on the substrate 100, on the pillar portion P, and in the trenches T. In some embodiments, the electrodes 102 may be conformally formed on the substrate 100, on the pillar portion P, and in the trenches T. The electrode 102 may directly contact the substrate 100. The electrode 102 and substrate 100 may have the same conductive type (e.g., N-type), so that the substrate 100 may be used as a portion of the electrode 102. The material of the electrode 102 is, for example, doped amorphous silicon or doped polysilicon. In some embodiments, when the material of the electrode 102 is doped amorphous silicon, in the subsequent high temperature process, the material of the electrode 102 will be changed from doped amorphous silicon to doped polysilicon. The method of forming the electrode 102 is, for example, a chemical vapor deposition method. In some embodiments, the patterning process may not be performed in the process of forming the electrode 102.

Referring to FIG. 1C, a dielectric layer 104 is formed on the electrode 102 and in the trenches T. In some embodiments, the dielectric layer 104 may be conformally formed on the electrode 102. The material of the dielectric layer 104 is, for example, silicon oxide, silicon nitride, a high dielectric constant material, or a combination thereof. In some embodiments, the dielectric layer 104 may be a composite layer of silicon oxide layer/silicon nitride layer/silicon oxide layer (ONO). In some embodiments, the method of forming the dielectric layer 104 is, for example, a thermal oxidation method, a chemical vapor deposition method, or a combination thereof. Furthermore, when the material of the electrode 102 is doped amorphous silicon, in the thermal oxidation process for forming the dielectric layer 104, the material of the electrode 102 may be changed from doped amorphous silicon to doped polysilicon.

Referring to FIG. 1D, an electrode material layer 106 may be formed on the dielectric layer 104 and in the trenches T. In some embodiments, the electrode material layer 106 may be conformally formed on dielectric layer 104. In some embodiments, the electrode material layer 106 and the substrate 100 may have the same conductive type (e.g., N-type). The material of the electrode material layer 106 is, for example, doped polysilicon. The method of forming the electrode material layer 106 is, for example, a chemical vapor deposition method.

Referring to FIG. 1E, a dielectric material layer 108 may be formed on the electrode material layer 106 and in the trenches T. In some embodiments, the dielectric material layer 108 may be conformally formed on the electrode material layer 106. The material of the dielectric material layer 108 is, for example, silicon oxide, silicon nitride, a high dielectric constant material, or a combination thereof. In some embodiments, the dielectric material layer 108 may be a composite layer of silicon oxide layer/silicon nitride layer/silicon oxide layer (ONO). In some embodiments, the method of forming the dielectric layer 108 is, for example, a thermal oxidation method, a chemical vapor deposition method, or a combination thereof.

Referring to FIG. 1F, an electrode material layer 110 may be formed on the dielectric material layer 108 and in the trenches T. The electrode material layer 110 has a groove G, and the groove G is located in the trench T. In some embodiments, the electrode material layer 110 may be conformally formed on the dielectric material layer 108. In some embodiments, the electrode material layer 110 and the substrate 100 may have the same conductive type (e.g., N-type). The material of the electrode material layer 110 is, for example, doped polysilicon. The method of forming the electrode material layer 110 is, for example, a chemical vapor deposition method.

Referring to FIG. 1G, a stop material layer 112 may be formed on the electrode material layer 110 and in the trenches T. In some embodiments, the stop material layer 112 may be conformally formed on the electrode material layer 110. The material of the stop material layer 112 is, for example, silicon oxide, silicon nitride, or a combination thereof. In some embodiments, the stop material layer 112 may be a composite layer of silicon oxide layer/silicon nitride layer (ON). In some embodiments, the method of forming the stop material layer 112 is, for example, a thermal oxidation method, a chemical vapor deposition method, or a combination thereof.

Referring to FIG. 1H, a stress balance material layer 114 may be formed on the stop material layer 112 and in the groove G. The material of the stress balance material layer 114 is, for example, undoped polysilicon. The method of forming the stress balance material layer 114 is, for example, a chemical vapor deposition method.

Referring to FIG. 1I, an etch back process may be performed on the stress balance material layer 114, thereby forming a stress balance layer 114a in the groove G. The etch back process is, for example, a dry etching process.

Referring to FIG. 1J, an etch back process may be performed on the stop material layer 112, thereby forming a stop layer 112a between the stress balance layer 114a and the electrode material layer 110. The etch back process is, for example, a dry etching process.

Referring to FIG. 1K, the electrode material layer 110, the dielectric material layer 108, and the electrode material layer 106 may be respectively patterned to form an electrode 110a, a dielectric layer 108a, and an electrode 106a. Therefore, the electrode 106a may be formed on the dielectric layer 104 and in the trenches T, the dielectric layer 108a may be formed on the electrode 106a and in the trenches T, and the electrode 110a may be formed on the dielectric layer 108a and in the trenches T. The electrode 110a has the groove G, and the groove G is located in the trench T. Moreover, the stop layer 112a may be formed between the stress balance layer 114a and the electrode 110a.

In some embodiments, the electrode 102, the electrode 106a, and the electrode 110a may have the same stress type. In the present embodiment, the stress types may include tensile stress and compressive stress. In some embodiments, the stress type of the stress balance layer 114a may be different from the stress type of the electrode 102, the electrode 106a, and the electrode 110a, and the stress balance layer 114a is located in the groove G, so the stress of the electrode 102, the stress of the electrode 106a, and the stress of the electrode 110a can be significantly offset by the stress of the stress balance layer 114a. In addition, the stress of the stress balance layer 114a may be adjusted by adjusting the width of the stress balance layer 114a. For example, when the stress type of the electrode 102, the electrode 106a, and the electrode 110a is tensile stress, the stress type of the stress balance layer 114a is compressive stress.

In some embodiments, the stress type of the dielectric layer 104 and the dielectric layer 108a may be different from the stress type of the electrode 102, the electrode 106a, and the electrode 110a, so the stress of the electrode 102, the stress of the electrode 106a, and the stress of the electrode 110a can be offset by the stress of the dielectric layer 104 and the stress of the dielectric layer 108a. For example, when the stress type of the electrode 102, the electrode 106a, and the electrode 110a is tensile stress, the stress type of the dielectric layer 104 and the dielectric layer 108a is compressive stress. In some embodiments, the stress type of the stop layer 112a may be different from the stress type of the electrode 102, the electrode 106a, and the electrode 110a, so the stress of the electrode 102, the stress of the electrode 106a, and the stress of the electrode 110a can be offset by the stress of the stop layer 112a. For example, when the stress type of the electrode 102, the electrode 106a, and the electrode 110a is tensile stress, the stress type of the stop layer 112a is compressive stress.

Referring to FIG. 1L, an isolation layer 116 may be formed on the dielectric layer 104, the electrode 106a, the dielectric layer 108a, the electrode 110a, the stop layer 112a, and the stress balance layer 114a. In some embodiments, the isolation layer 116 may be conformally formed on the dielectric layer 104, the electrode 106a, the dielectric layer 108a, the electrode 110a, the stop layer 112a, and the stress balance layer 114a. The material of the isolation layer 116 is, for example, non-doped silicate glass (NSG). The method of forming the isolation layer 116 is, for example, a chemical vapor deposition method.

Referring to FIG. 1M, a dielectric layer 118 may be formed on the dielectric layer 104, the electrode 106a, the dielectric layer 108a, the electrode 110a, the stop layer 112a, and the stress balance layer 114a. For example, dielectric layer 118 may be formed on isolation layer 116. The material of the dielectric layer 118 is, for example, boron-doped phosphosilicate glass (BPSG). The method of forming the dielectric layer 118 is, for example, a chemical vapor deposition method. Furthermore, the isolation layer 116 can be used to prevent dopants in dielectric layer 118 from diffusing into underlying layers.

Referring to FIG. 1N, an opening OP1, an opening OP2, and an opening OP3 may be formed in the dielectric layer 118. The opening OP1 may extend into the isolation layer 116 and the dielectric layer 104. The opening OP1 may expose the electrode 102. The opening OP2 may extend into the isolation layer 116 and the dielectric layer 108a. The opening OP2 may expose electrode 106a. The opening OP3 may extend into the isolation layer 116. The opening OP3 may expose the electrode 110a. The method of forming the opening OP1 is, for example, patterning the dielectric layer 118, the isolation layer 116, and the dielectric layer 104 by a lithography process and an etching process. The method of forming the opening OP2 is, for example, patterning the dielectric layer 118, the isolation layer 116, and the dielectric layer 108a by a lithography process and an etching process. The method of forming the opening OP3 is, for example, patterning the dielectric layer 118 and the isolation layer 116 by a lithography process and an etching process.

Moreover, there may be an inclination angle θ1 between the sidewall and the bottom surface of the opening OP1. There may be an inclination angle θ2 between the sidewall and the bottom surface of the opening OP2. There may be an inclination angle θ3 between the sidewall and the bottom surface of the opening OP3. In some embodiments, the angle ranges of the inclination angle θ1, the inclination angle θ2, and the inclination angle θ3 may be 100 degrees to 115 degrees, respectively.

Referring to FIG. 1O, a contact 120a, a contact 120b, and a contact 120c may be respectively formed in opening OP1, opening OP2, and opening OP3. Since the opening OP1, the opening OP2, and the opening OP3 may respectively have the inclination angle θ1, the inclination angle θ2, and the inclination angle θ3, and the angle ranges of the inclination angle θ1, the inclination angle θ2, and the inclination angle θ3 may be 100 degrees to 115 degrees, respectively, thereby improving the thickness uniformity of the contact 120a, the contact 120b, and the contact 120c respectively located in the opening OP1, the opening OP2, and the opening OP3.

In addition, the contact 120a, the contact 120b and the contact 120c may be electrically connected to the electrode 102, the electrode 106a and the electrode 110a respectively. There may be the inclination angle θ1 between the sidewall and the bottom surface of the contact 120a. There may be the inclination angle θ2 between the sidewall and the bottom surface of the contact 120b. There may be the inclination angle θ3 between the sidewall and the bottom surface of the contact 120c. The material of the contact 120a, the contact 120b, and the contact 120c is, for example, aluminum-copper alloy (AlCu), but the invention is not limited thereto. The method of forming the contact 120a, the contact 120b, and the contact 120c may include forming a contact material layer (not shown) by a physical vapor deposition process (e.g., sputtering process), and then performing a patterning process on the contact material layer.

Referring to FIG. 1P, a passivation layer 122 may be formed on the contact 120a, the contact 120b, the contact 120c, and the dielectric layer 118. The material of the passivation layer 122 is, for example, silicon oxide, silicon nitride, or a combination thereof. The method of forming the passivation layer 122 is, for example, a chemical vapor deposition method.

In the subsequent processes, an interconnect structure (not shown), a first pad (not shown), and a second pad (not shown) may be formed. The contact 120a and the contact 120c may be electrically connected to the first pad by the interconnect structure, and the contact 120b may be electrically connected to the second pad by the interconnect structure. The first pad and the second pad may be used to connect to different voltage sources. Since the subsequent processes of forming the interconnect structure, the first pad, and the second pads are well known to one of ordinary skill in the art, the description thereof is omitted here.

Hereinafter, the capacitor structure 10 of the above embodiment is described with reference to FIG. 1P.

Referring to FIG. 1P, a capacitor structure 10 includes a substrate 100, an electrode 102, a dielectric layer 104, an electrode 106a, a dielectric layer 108a, an electrode 110a, and a stress balance layer 114a. In some embodiments, the capacitor structure 10 may be a silicon capacitor. The substrate 100 has trenches T and a pillar portion P located between two adjacent trenches T. The electrode 102 is disposed on the substrate 100, on the pillar portion P, and in the trenches T. In some embodiments, the electrodes 102 may be conformally disposed on the substrate 100, on the pillar portion P, and in the trenches T. The dielectric layer 104 is disposed on the electrode 102 and in the trenches T. In some embodiments, the dielectric layer 104 may be conformally disposed on the electrode 102. The electrode 106a is disposed on the dielectric layer 104 and in the trenches T. In some embodiments, the electrode 106a may be conformally disposed on the dielectric layer 104. The dielectric layer 108a is disposed on the electrode 106a and in the trenches T. In some embodiments, the dielectric layer 108a may be conformally disposed on the electrode 106a. The electrode 110a is disposed on the dielectric layer 108a and in the trenches T. In some embodiments, the electrode 110a may be conformally disposed on the dielectric layer 108a. The electrode 110a has a groove G, and the groove G is located in the trench T. The stress balance layer 114a is disposed in the groove G. In some embodiments, the electrode 102 and the electrode 110a may be electrically connected to each other. For example, the electrode 102 and the electrode 110a may be electrically connected to each other by an interconnect structure.

Furthermore, the capacitor structure 10 may further include at least one of a stop layer 112a, a dielectric layer 118, an isolation layer 116, a contact 120a, a contact 120b, a contact 120c, and a passivation layer 122. The stop layer 112a is disposed between the stress balance layer 114a and the electrode 110a. The dielectric layer 118 is disposed on the dielectric layer 104, the electrode 106a, the dielectric layer 108a, the electrode 110a, the stop layer 112a, and the stress balance layer 114a. The dielectric layer 118 has an opening OP1, an opening OP2, and an opening OP3. The opening OP1 exposes the electrode 102. The opening OP2 exposes the electrode 106a. The opening OP3 exposes the electrode 110a. The isolation layer 116 is disposed between the dielectric layer 118 and the dielectric layer 104, between the dielectric layer 118 and the electrode 106a, between the dielectric layer 118 and the dielectric layer 108a, between the dielectric layer 118 and the electrode 110a, between the dielectric layer 118 and the stop layer 112a, and between the dielectric layer 118 and the stress balance layer 114a. The contact 120a is disposed in the opening OP1 and is electrically connected to the electrode 102. The contact 120b is disposed in the opening OP2 and is electrically connected to the electrode 106a. The contact 120c is disposed in the opening OP3 and is electrically connected to the electrode 110a. The passivation layer 122 is disposed on the contact 120a, the contact 120b, the contact 120c, and the dielectric layer 118.

In addition, the details of the components in the capacitor structure 10 have been described in detail in the above embodiments, and the description thereof is not repeated here.

Based on the above embodiments, in the capacitor structure 10 and the manufacturing method thereof, the stress balance layer 114a is located in the groove G of the electrode 110a. Since the stress of the electrode 102, the stress of the electrode 106a, and the stress of the electrode 110a can be significantly offset by the stress of the stress balance layer 114a, the warpage of the substrate 100 can be prevented, which enables the subsequent processes to proceed smoothly.

In summary, in the capacitor structure and the manufacturing method thereof of the aforementioned embodiments, the stress of the electrode can be significantly offset by the stress of the stress balance layer, so that the warpage of the substrate can be prevented, which enables the subsequent processes to proceed smoothly.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A capacitor structure, comprising:
    a substrate having trenches and a pillar portion located between two adjacent trenches;
    a first electrode disposed on the substrate, on the pillar portion, and in the trenches;
    a first dielectric layer disposed on the first electrode and in the trenches;
    a second electrode disposed on the first dielectric layer and in the trenches;
    a second dielectric layer disposed on the second electrode and in the trenches;
    a third electrode disposed on the second dielectric layer and in the trenches, wherein the third electrode has a groove, and the groove is located in the trench;
    a stress balance layer disposed in the groove; and
    a third dielectric layer disposed on the first dielectric layer, the second electrode, the second dielectric layer, the third electrode, and the stress balance layer and having a first opening, a second opening, and a third opening, wherein the first opening exposes the first electrode, the second opening exposes the second electrode, and the third opening exposes the third electrode.

2. The capacitor structure according to claim 1, wherein the first electrode directly contacts the substrate.

3. The capacitor structure according to claim 1, wherein the first electrode, the second electrode, and the third electrode have the same stress type.

4. The capacitor structure according to claim 1, wherein a stress type of the stress balance layer is different from a stress type of the first electrode, the second electrode, and the third electrode.

5. The capacitor structure according to claim 1, wherein a stress types of the first dielectric layer and the second dielectric layer is different from a stress type of the first electrode, the second electrode, and the third electrode.

6. The capacitor structure according to claim 1, further comprising:
    a stop layer disposed between the stress balance layer and the third electrode.

7. The capacitor structure according to claim 1, wherein a stress type of the stop layer is different from a stress type of the first electrode, the second electrode, and the third electrode.

8. The capacitor structure according to claim 1, wherein there is a first inclination angle between a sidewall and a bottom surface of the first opening, there is a second inclination angle between a sidewall and a bottom surface of the second opening, and there is a third inclination angle between a sidewall and a bottom surface of the third opening.

9. The capacitor structure according to claim 8, wherein angle ranges of the first inclination angle, the second inclination angle, and the third inclination angle are 100 degrees to 115 degrees, respectively.

10. The capacitor structure according to claim 1, further comprising:
    a first contact disposed in the first opening and electrically connected to the first electrode;
    a second contact disposed in the second opening and electrically connected to the second electrode; and
    a third contact disposed in the third opening and electrically connected to the third electrode.

11. The capacitor structure according to claim 10, wherein there is a first inclination angle between a sidewall and a bottom surface of the first contact, there is a second inclination angle between a sidewall and a bottom surface of the second contact, and there is a third inclination angle between a sidewall and a bottom surface of the third contact.

12. The capacitor structure according to claim 10, further comprising:
    a passivation layer disposed on the first contact, the second contact, the third contact, and the third dielectric layer.

13. The capacitor structure according to claim 1, further comprising:
    an isolation layer disposed between the third dielectric layer and the first dielectric layer, between the third dielectric layer and the second electrode, between the third dielectric layer and the second dielectric layer, between the third dielectric layer and the third electrode, and between the third dielectric layer and the stress balance layer, wherein the first opening, the second opening, and the third opening respectively extend into the isolation layer.

14. The capacitor structure according to claim 1, wherein the first electrode and the third electrode are electrically connected to each other by an interconnect structure.

15. A manufacturing method of a capacitor structure, comprising:
    providing a substrate, wherein the substrate has trenches and a pillar portion located between two adjacent trenches;
    forming a first electrode on the substrate, on the pillar portion, and in the trenches;
    forming a first dielectric layer on the first electrode and in the trenches;
    forming a second electrode on the first dielectric layer and in the trenches;
    forming a second dielectric layer on the second electrode and in the trenches;
    forming a third electrode on the second dielectric layer and in the trenches, wherein the third electrode has a groove, and the groove is located in the trench;
    forming a stress balance layer in the groove;

forming a third dielectric layer on the first dielectric layer, the second electrode, the second dielectric layer, the third electrode, and the stress balance layer; and forming a first opening, a second opening, and a third opening in the third dielectric layer, wherein the first opening exposes the first electrode, the second opening exposes the second electrode, and the third opening exposes the third electrode.

16. The manufacturing method of the capacitor structure according to claim 15, further comprising
forming a stop layer between the stress balance layer and the third electrode.

17. The manufacturing method of the capacitor structure according to claim 15, further comprising:
respectively forming a first contact, a second contact, and a third contact in the first opening, the second opening, and the third opening, wherein the first contact, the second contact, and the third contact are electrically connected to the first electrode, the second electrode, and the third electrode respectively.

18. The manufacturing method of the capacitor structure according to claim 17, wherein there is a first inclination angle between a sidewall and a bottom surface of the first contact, there is a second inclination angle between a sidewall and a bottom surface of the second contact, and there is a third inclination angle between a sidewall and a bottom surface of the third contact.

* * * * *